(12) United States Patent  
Xie et al.

(10) Patent No.: US 12,406,930 B2  
(45) Date of Patent: Sep. 2, 2025

(54) STRUCTURE CONTAINING A VIA-TO-BURIED POWER RAIL CONTACT STRUCTURE OR A VIA-TO-BACKSIDE POWER RAIL CONTACT STRUCTURE

(71) Applicant: International Business Machines Corporation, Armonk, NY (US)

(72) Inventors: Ruilong Xie, Niskayuna, NY (US); Stuart Sieg, Albany, NY (US); Kevin Shawn Petrarca, Newburgh, NY (US); Eric Miller, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 775 days.

(21) Appl. No.: 17/512,744

(22) Filed: Oct. 28, 2021

(65) Prior Publication Data

US 2023/0139929 A1 May 4, 2023

(51) Int. Cl.
*H01L 23/528* (2006.01)
*H01L 23/48* (2006.01)
(Continued)

(52) U.S. Cl.
CPC ........ *H01L 23/5286* (2013.01); *H01L 23/481* (2013.01); *H10D 64/021* (2025.01); *H10D 62/121* (2025.01); *H10D 84/981* (2025.01)

(58) Field of Classification Search
CPC .................................................. H01L 23/5286
See application file for complete search history.

(56) References Cited

U.S. PATENT DOCUMENTS 7,002,187 B1 2/2006 Husher
9,570,395 B1 2/2017 Sengupta et al.
(Continued)

FOREIGN PATENT DOCUMENTS

EP 3454366 A1 3/2019
EP 3770952 A1 1/2021
(Continued)

OTHER PUBLICATIONS

International Search Report dated Jan. 31, 2023, received in a corresponding foreign application, 10 pages.
Altamirano-Sanchez, E., et al., "Area Selective Deposition: Challenges and Opportunities for Patterning Solution", ASD workshop Apr. 4-5, 2019, 38 pages.
(Continued)

*Primary Examiner* — Peter M Albrecht
(74) *Attorney, Agent, or Firm* — Scully, Scott, Murphy & Presser, P.C.; Samuel Waldbaum

(57) ABSTRACT

A semiconductor structure is provided in which a via to buried power rail (VBPR) contact structure is present that has a via portion contacting a buried power rail and a non-via portion contacting a source/drain region of a first functional gate structure present in a first device region. A dielectric spacer structure including a base dielectric spacer and a replacement dielectric spacer is located between the VPBR contact structure and the first functional gate structure. The replacement dielectric spacer is composed of a gate cut trench dielectric material that is also present in a gate cut trench that is located between the first functional gate structure present in the first device region, and a second functional gate structure that is present in a second device region. The replacement dielectric spacer replaces a damaged region of a dielectric spacer that is originally present during VBPR formation.

10 Claims, 28 Drawing Sheets

(51) Int. Cl.
*H10D 64/01* (2025.01)
*H10D 62/10* (2025.01)
*H10D 84/90* (2025.01)

(56) References Cited

U.S. PATENT DOCUMENTS

| | | |
|---|---|---|
| 9,716,162 B2 | 7/2017 | Park et al. |
| 10,475,692 B2 | 11/2019 | Licausi et al. |
| 10,607,991 B2 | 3/2020 | Bergendahl et al. |
| 10,770,479 B2 | 9/2020 | Smith et al. |
| 10,998,238 B2 | 5/2021 | Ching et al. |
| 2019/0067091 A1 | 2/2019 | Morrow et al. |
| 2019/0386011 A1 | 12/2019 | Weckx et al. |
| 2020/0134128 A1 | 4/2020 | Peng et al. |
| 2020/0135578 A1 | 4/2020 | Ching et al. |
| 2020/0135634 A1 | 4/2020 | Chiang et al. |
| 2020/0135724 A1 | 4/2020 | Lin et al. |
| 2021/0028112 A1 | 1/2021 | Kim et al. |
| 2021/0098294 A1 | 4/2021 | Smith et al. |
| 2021/0336063 A1* | 10/2021 | Liao .................. H01L 23/5286 |

FOREIGN PATENT DOCUMENTS

| | | |
|---|---|---|
| EP | 4423811 A1 | 9/2024 |
| JP | 2023-066390 A | 5/2023 |
| WO | 2023/073483 A1 | 5/2023 |

OTHER PUBLICATIONS

Gupta, A., et al., "Buried Power Rail integration with Si FinFETs for CMOS scaling beyond the 5 nm Node", 2020 Symposia on VLSI Technology and Circuits, Jun. 2020, 21 pages.

Gupta, A., et al., "Buried Power Rail Integration with Si FinFETs for CMOS Scaling beyond the 5 nm Node", 2020 IEEE Symposium on VLSI Technology, Date of Conference: Jun. 16-19, 2020, 2 pages.

Gupta, A., et al., "Buried Power Rail Scaling and Metal Assessment for the 3 nm Node and Beyond", 2020 IEEE International Electron Devices Meeting (IEDM), Date of Conference: Dec. 12-18, 2020, 4 pages.

Prasad, D., et al., "Buried Power Rails and Back-side Power Grids: Arm CPU Power Delivery Network Design Beyond 5nm", 2019 IEEE International Electron Devices Meeting (IEDM), Date of Conference: Dec. 7-11, 2019, 4 pages.

Moroz, V., et al., "Can We Ever Get to a 100 nm Tall Library? Power Rail Design for 1nm Technology Node", 2020 IEEE Symposium on VLSI Technology, Date of Conference: Jun. 16-19, 2020, 2 pages.

Mathur, R., et al., "Buried Bitline for sub-5nm SRAM Design", 2020 IEEE International Electron Devices Meeting (IEDM), Date of Conference: Dec. 12-18, 2020, 4 pages.

Mallik, A., et al., "Economics of semiconductor scaling—a cost analysis for advanced technology node", 2019 Symposium on VLSI Technology, Date of Conference: Jun. 9-14, 2019, 2 pages.

Schuddinck, P., et al., "Device-, Circuit- & Block-level evaluation of CFET in a 4 track library", 2019 Symposium on VLSI Technology, Date of Conference: Jun. 9-14, 2019, 2 pages.

* cited by examiner

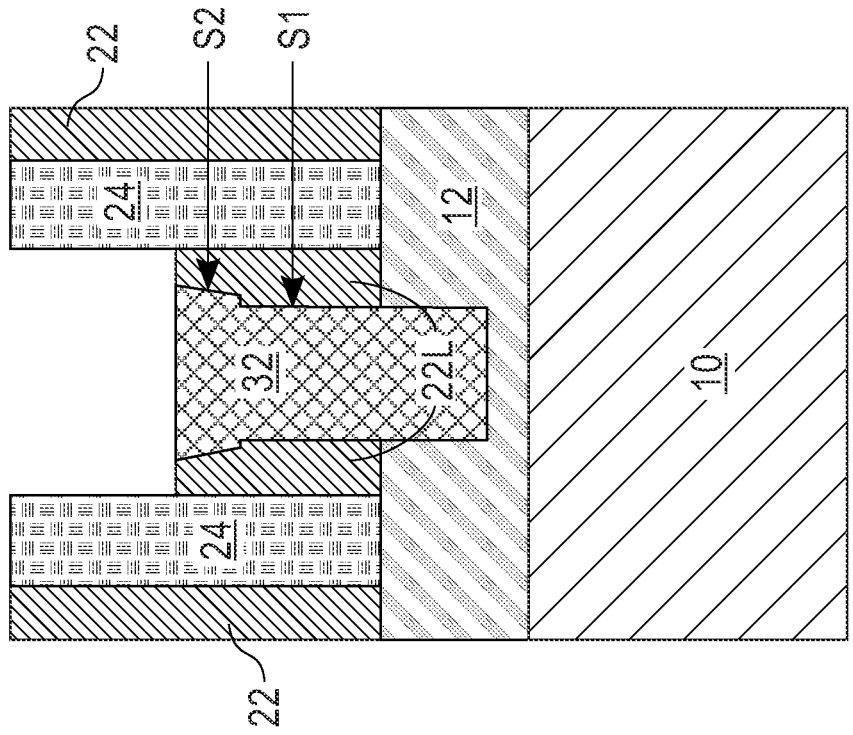
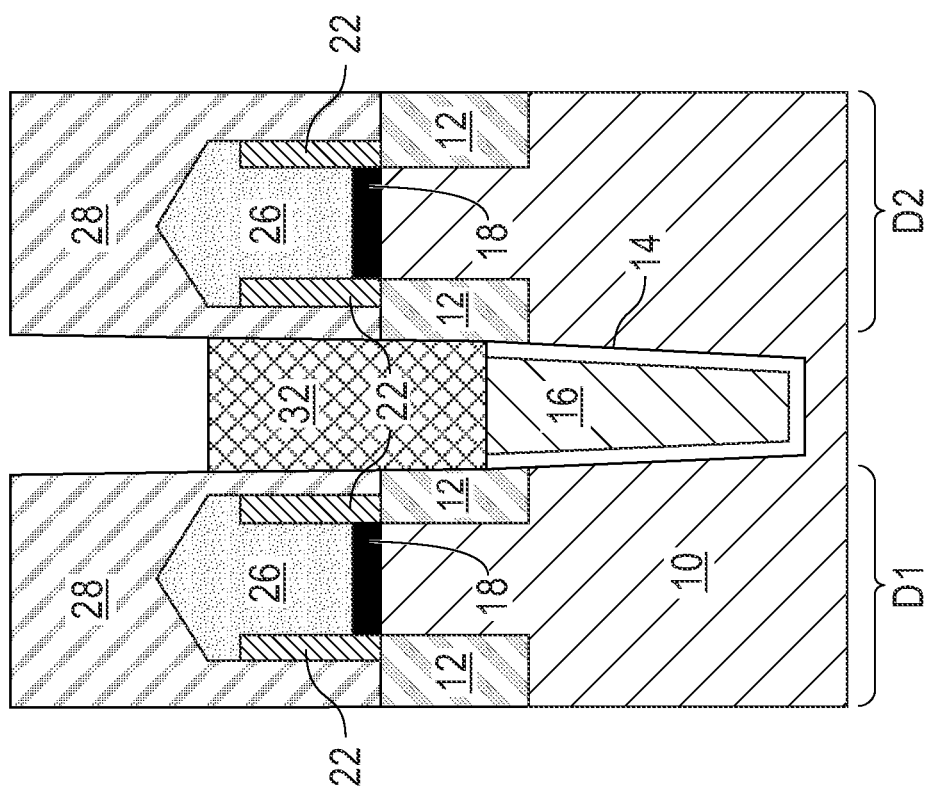
FIG. 4C
FIG. 4B

STRUCTURE CONTAINING A VIA-TO-BURIED POWER RAIL CONTACT STRUCTURE OR A VIA-TO-BACKSIDE POWER RAIL CONTACT STRUCTURE

BACKGROUND

The present application relates to semiconductor technology, and more particularly to a semiconductor structure with reduced via-to-buried power rail contact structure (or via-to-backside power rail contact structure) to gate-end shorts.

When forming a structure including a plurality of complementary metal oxide semiconductor (CMOS) devices, such as integrated circuits, standard cells may be used as a base unit for designing and manufacturing the integrated circuits. The standard cell(s) may be used to form one or more functional circuits, and each standard cell may have the same footprint (e.g., may have a standard footprint). Using standard cells when designing complex circuits and components reduces design and manufacture costs.

In use, each standard cell of a semiconductor device requires power input (Vdd) and ground (Vss) connections. To power the various components thereof, each standard cell is generally coupled to a power rail which is electrically connected to an active layer of the standard cell to provide the power (Vdd). In some instances, a plurality of power rails may be provided for each standard cell to respectively provide the power (Vdd) and the ground (Vss).

Conventional power rails are formed in the back-end-of-line (BEOL) levels. To improve the scaling and reduce the routing complexity of the signal lines, one method is to move the power rails away from BEOL and form them beneath the active semiconductor devices. One typical structure is a buried power rail, which is typically embedded in a shallow trench isolation structure of a semiconductor device. Another typical example is a backside power rail, which is formed after a wafer is flipped with a substrate thinning or removal. Such buried power rails or backside power rails are connected to source/drain regions of a functional gate structure utilizing a VBPR contact structure. The term 'VBPR' is used throughout the present application to denote both a via-to-buried power rail contact structure or a via-to-backside power rail contact structure. A top concern in VBPR contact structure integration is VBPR contact structure to gate-end shorts, because at worst case lithographic mis-alignment, the dielectric spacer/gate dielectric cap are etched twice during the etching of the contact openings. There is thus a need of providing a semiconductor structure having reduced VBPR contact structure to gate-end shorts.

SUMMARY

A semiconductor structure is provided in which a VBPR contact structure is present that has a via portion contacting a buried power rail or a backside power rail and a non-via portion contacting a source/drain region of a first functional gate structure present in a first device region. A dielectric spacer structure including a base dielectric spacer and a replacement dielectric spacer is located between the VBPR contact structure and the first functional gate structure. The replacement dielectric spacer is composed of a gate cut trench dielectric material that is also present in a gate cut trench that is located between the first functional gate structure present in the first device region, and a second functional gate structure that is present in a second device region. The replacement dielectric spacer replaces a damaged region of a dielectric spacer that is originally present during VBPR formation, and thus reduces the VBPR to gate-end short problem that exists in typical VBPR formation.

In one aspect of the present application, a semiconductor structure that has reduced VBPR contact structure to gate-end shorts is provided. In one embodiment of the present application, the semiconductor structure includes a first device region including at least one first functional gate structure, and a second device region that is located laterally adjacent to the first device region and includes at least one second functional gate structure. A shallow trench isolation structure is located between the first device region and the second device region, and a buried power rail is located in the shallow trench isolation structure. A via-to-buried power rail contact structure is present that has a via portion contacting a surface of the buried power rail and a non-via portion contacting a source/drain region of the at least one first functional gate structure. A dielectric spacer structure is located along a side of the at least one first functional gate structure that is laterally adjacent to the via portion of the via-to-buried power rail contact structure, the dielectric spacer structure includes a base dielectric spacer and a replacement dielectric spacer.

In another embodiment of the present application, the semiconductor structure includes a first device region including at least one first functional gate structure, and a second device region that is located laterally adjacent to the first device region and includes at least one second functional gate structure. A shallow trench isolation structure is located between the first device region and the second device region. A backside power rail is located in a backside interconnect dielectric material layer that is present on a backside surface of the shallow trench isolation structure. A via-to-backside power rail contact structure is present that has a via portion contacting a surface of the backside power rail and a non-via portion contacting a source/drain region of the at least one first functional gate structure. A dielectric spacer structure is located along a side of the at least one first functional gate structure that is laterally adjacent to the via portion of the via-to-backside power rail contact structure, the dielectric spacer structure includes a base dielectric spacer and a replacement dielectric spacer.

In another aspect of the present application, methods of forming a semiconductor structure that has reduced VBPR contact structure to gate-end shorts is provided. In one embodiment, the method includes forming a structure comprising a first device region and a second device region, wherein a shallow trench isolation structure containing a buried power rail is located between the first device region and the second device region, and at least one sacrificial gate structure runs through each of the first device region, a region including the shallow trench isolation structure and the second device region, wherein a dielectric spacer is present along a sidewall of at least one sacrificial gate structure. A VBPR contact structure opening is then formed that physically exposes a surface of the buried power rail, wherein during the forming of the VBPR contact structure opening an upper portion of the dielectric spacer is damaged. The upper portion of the dielectric spacer that is damaged is removed, while maintaining a lower portion of the dielectric spacer in the VBPR contact structure opening. Next, a bilayer dielectric cap structure is formed in the VBPR contact structure opening and on a topmost surface of the lower portion of the dielectric spacer, wherein the bilayer dielectric cap structure includes an outer dielectric material layer located laterally adjacent to, and surrounding, an inner dielectric material layer. The at least one least one sacrificial gate structure is then removed from the region including the shallow trench isolation structure to form gate cut trench. The outer dielectric material layer is then removed from above the lower portion of the dielectric spacer, and thereafter a gate cut dielectric material is formed in the gate cut trench and above the lower portion of the dielectric spacer, wherein the gate cut dielectric material that is present on the lower portion of the dielectric spacer provides a replacement dielectric spacer. The at least one sacrificial gate structure that is present in the first device region and the second device region is then replaced with a functional gate structure. Next, a VBPR contact structure is formed having a via portion contacting the buried power rail, and a non-via portion containing a source/drain region of the functional gate structure present in the first device region.

The above described method can be modified to form a backside power rail instead of a buried power rail. In such an embodiment, the method does not include forming a buried power rail in the shallow trench isolation structure, but instead forms a backside power rail after forming the VBPR contact structure.

BRIEF DESCRIPTION OF THE DRAWINGS

FIGS. 4A, 4B and 4C are various views of the exemplary structure shown in FIGS. 3A, 3B and 3C, respectively, after removing a physically exposed upper portion of the dielectric spacer in the VBPR contact structure opening, while maintaining a lower portion of the dielectric spacer (hereinafter "base dielectric spacer") laterally adjacent to the sacrificial material structure.

DETAILED DESCRIPTION

Figure 1A:
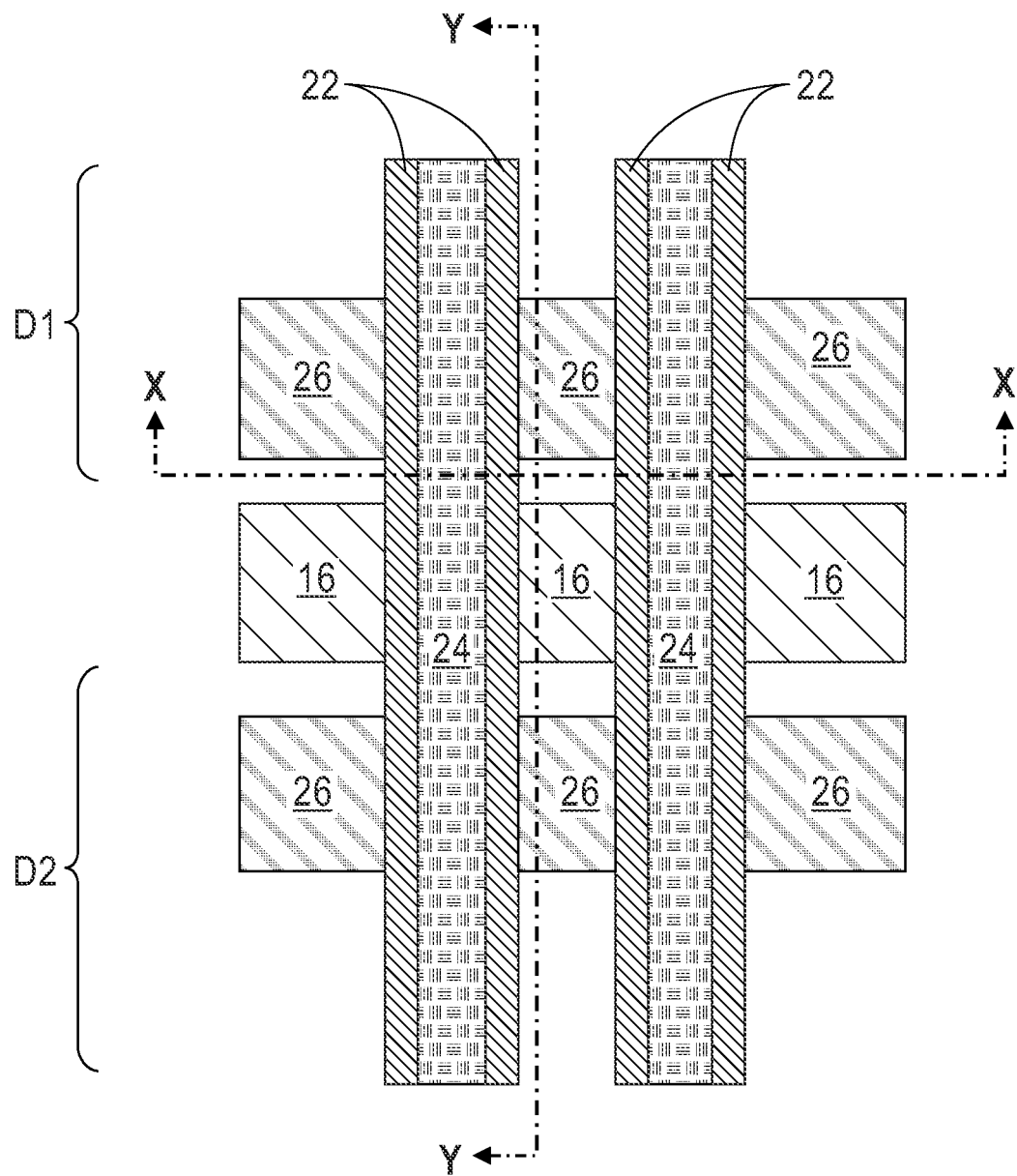
FIGS. 1A, 1B and 1C are various views of an exemplary structure that can be employed in the present application, the exemplary structure includes a shallow trench isolation structure separating a first device region from a second device region, and a buried power rail located in the shallow trench isolation structure, the structure further includes at least one sacrificial gate structure located in each of the first device region, the second device region, and a region including the shallow trench isolation structure, a dielectric spacer located on a sidewall of the at least one sacrificial gate structure, and source/drain regions located laterally adjacent to, and on each side of, the at least one sacrificial gate structure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 14B:
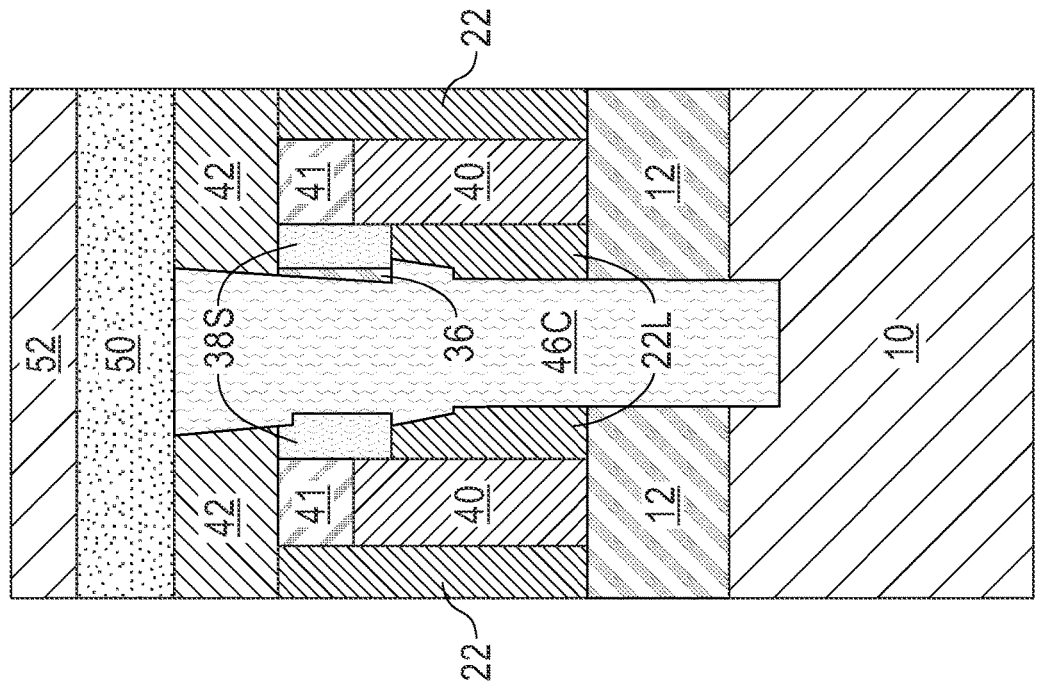
FIGS. 14A and 14B are cross sectional views through cut Y-Y and X-X, respectively, shown in FIG. 1 of another exemplary structure in accordance with yet another embodiment of the present application.
Figure 14A:
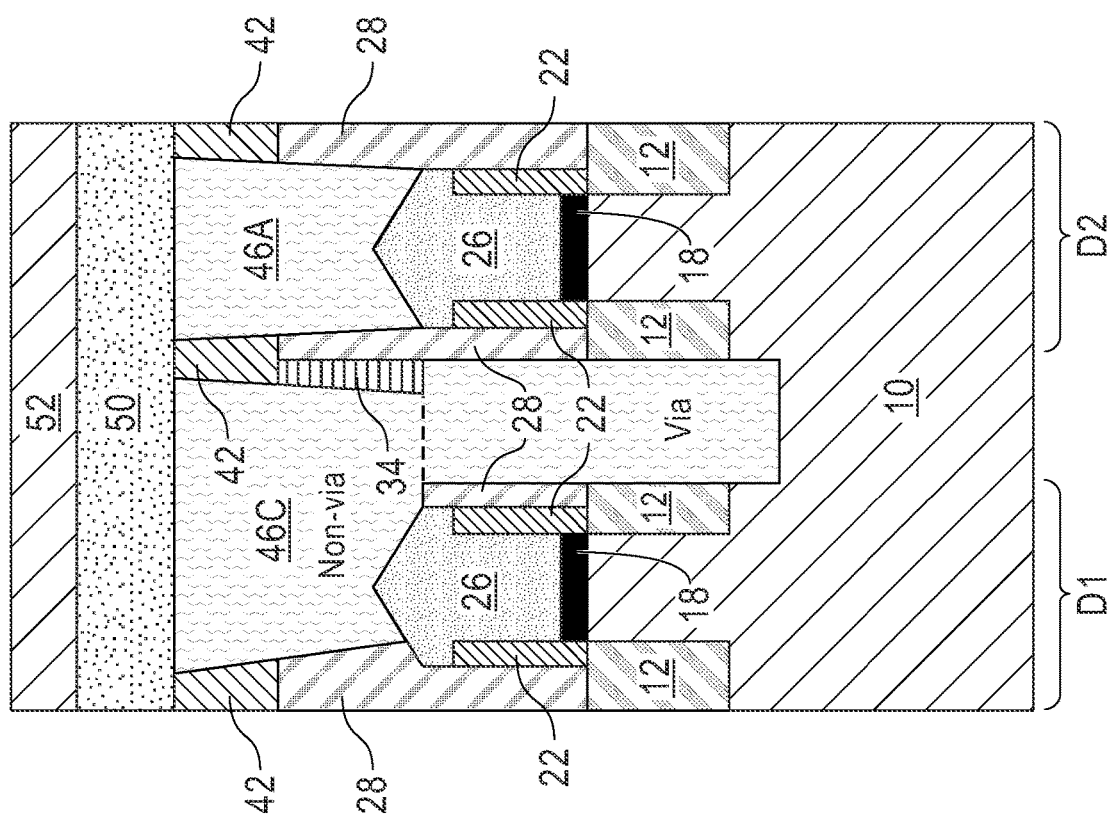
Figure 15A:
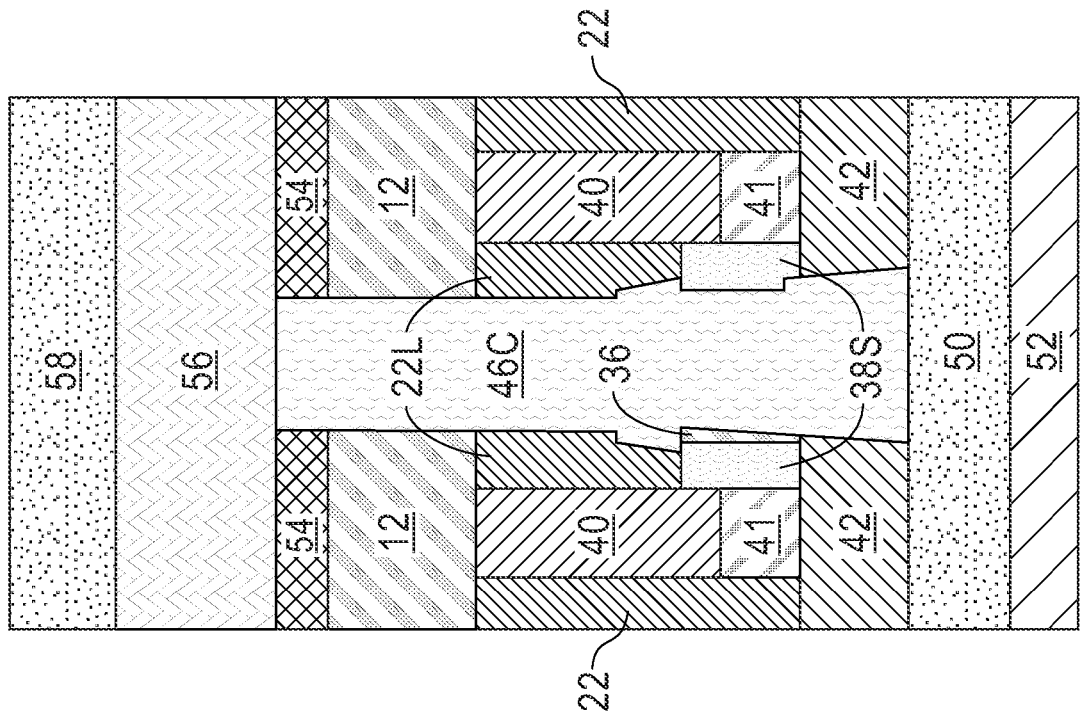
FIGS. 15A and 15B are cross sectional views of the exemplary structure shown in FIGS. 14A and 14B, respectively, after further device processing include flipping the structure 180°, semiconductor substrate removal, backside interlayer dielectric material layer deposition, backside power rail formation, and backside power distribution network formation.
Figure 15B:
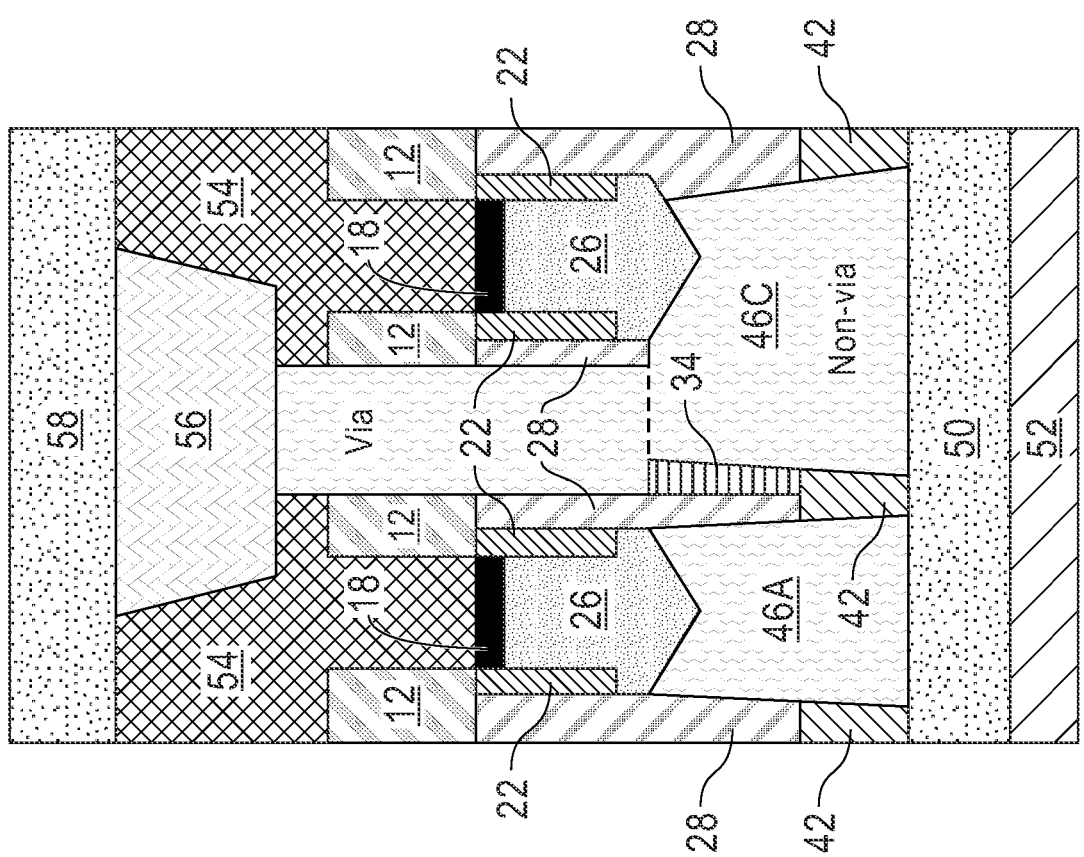

Before discussing the present application in detail, the present application provides various views showing an exemplary structure through various processing steps of the present application. FIGS. 1A, 2A, 3A, 4A, 5A, 6A, 7A, 8A, 9A, 10A, 11A, 12A and 13A are top down views illustrating a basic cell layout that can be employed in the present application. In those top down views only essential elements/components required for orientation purposes are shown;

non-essential elements/components not required for orientation purposes have been omitted from the top down views. Each of the top down views includes a cut Y-Y and a cut X-X. Cut Y-Y is in an area located between two adjacent gate structures (sacrificial gate structures or functional gate structure) that are present in a first device region and a second device region, while cut X-X is an area between a source/drain region of the gate structures present in the first device region and a region including a VBPR contact structure. Cut Y-Y runs parallel to each gate structure, while cut X-X runs perpendicular to each gate structure. FIGS. 1B, 2B, 3B, 4B, 5B, 6B, 7B, 8B, 9B, 10B, 11B, 12B and 13B are cross sectional views along cut Y-Y, and FIGS. 1C, 2C, 3C, 4C, 5C, 6C, 7C, 8C, 9C, 10C, 11C, 12C and 13C are cross sectional views along cut X-X. With respect to FIGS. 14A, 14B, 15A and 15B, there are shown an exemplary structure in accordance with another embodiment of the present application. The exemplary structure shown in FIGS. 14A and 15A are cross sectional views along cut Y-Y, while the exemplary structure shown in FIGS. 14B and 15B are cross sectional views along cut X-X, Each gate structure is located on a surface of a semiconductor channel material structure. So as not to obscure the exemplary structures of the present application, the semiconductor channel material structures are not shown in the various views provided in the present application. The semiconductor channel material structures would be located beneath the source/drain regions shown in FIGS. 1A, 2A, 3A, 4A, 5A, 6A, 7A, 8A, 9A, 10A, 11A, 12A. and 13A, and would run perpendicular to the gate structure. Exemplary semiconductor channel material structures that can be employed in the present application can include semiconductor nanosheets (including, for example, vertically stacked semiconductor channel material nanosheets), semiconductor nanowires (including, for example, vertically stacked semiconductor nanowires), semiconductor fins, or any other like semiconductor channel material structure. The semiconductor channel material structure includes at least one semiconductor material such as, for example, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials (e.g., a multilayered stack of Si and SiGe). The present application allows works when the semiconductor channel material structure is an upper portion of a semiconductor substrate.

When semiconductor nanosheets are employed, a nanosheet device is provided that includes at least one semiconductor nanosheet and a functional gate structure that is formed on physically exposed surfaces of the at least one semiconductor nanosheet. When semiconductor fins are employed, a finFET device is provided that includes at least one semiconductor fin and a functional gate structure that is formed on physically exposed surfaces of the at least one semiconductor fin. When semiconductor nanowires are employed, a semiconductor nanowire device is provided that includes at least one semiconductor nanowire and a functional gate structure that is formed on physically exposed surfaces of the at least one semiconductor wire. When a semiconductor substrate is employed as the semiconductor channel structure, a planar semiconductor device is provided that includes a functional gate structure located on a semiconductor material surface of the semiconductor substrate.

Figure 1C:
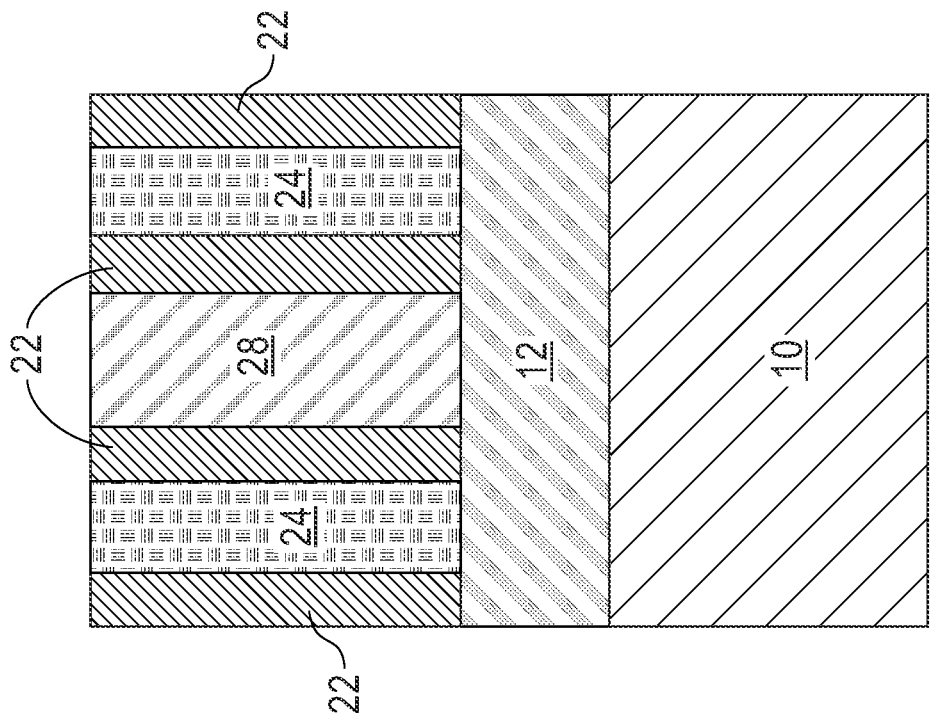
Figure 1B:
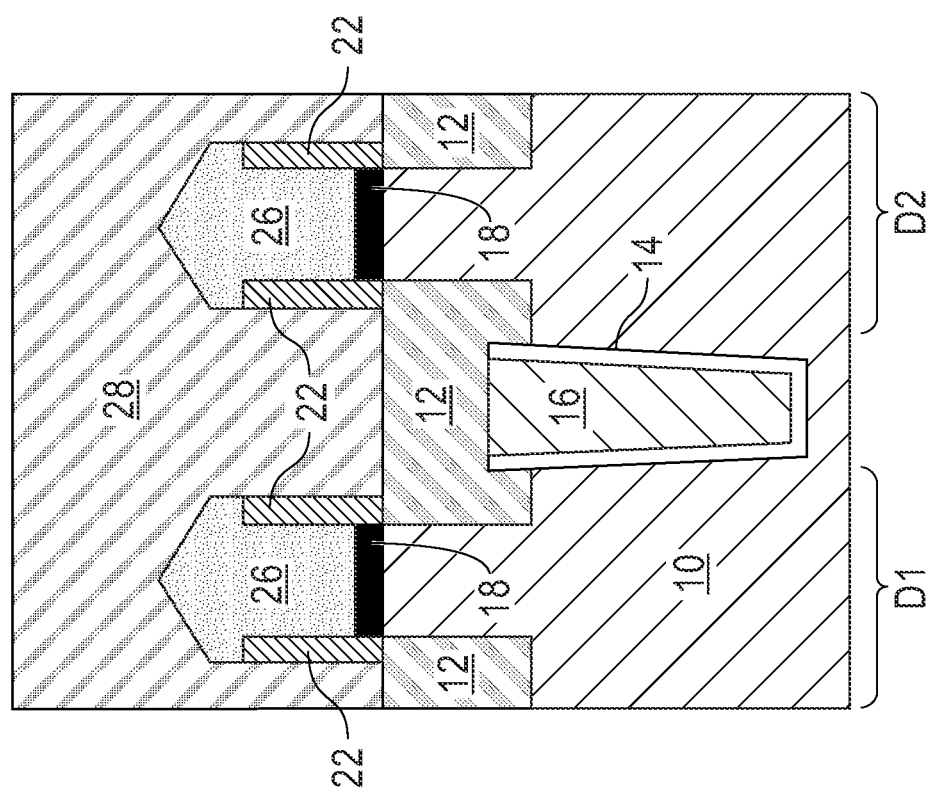

Referring first to FIGS. 1A, 1B and 1C, there are shown various views of an exemplary structure that can be employed in the present application. The exemplary structure shown in FIGS. 1A, 1B and 1C includes a shallow trench isolation structure 12 separating a first device region D1 from a second device region D2. The shallow trench isolation structure 12 is omitted from the top down view shown in FIG. 1A. A buried power rail 16 is located in the shallow trench isolation structure 12. As is shown, the buried power rail 16 has an upper portion that is located in the shallow trench isolation structure 12 and a lower portion that extends into semiconductor substrate 10. In some embodiments, the buried power rail 16 includes a buried power rail dielectric material liner 14. When present, the buried power rail dielectric material liner 14 is present on a sidewall and a bottommost surface of the buried power rail 16. In some embodiments, and as will be described with respect to the embodiment illustrated in FIGS. 14A-15B, there is no power rail formation in the shallow trench isolation region at this stage of fabrication. In such an embodiment, a backside power rail and an additional backside power distribution network will be formed after wafer flipping and substrate thinning (or removal), as shown in FIGS. 15A-15B.

The exemplary structure shown in FIGS. 1A, 1B and 1C further includes at least one sacrificial gate structure 24 (two sacrificial gate structures 24 are shown in the drawings of the present application by way of one example) located in each of the first device region D1, the second device region D2, and a region including the shallow trench isolation structure 12 (and the buried power rail 16). A dielectric spacer 22 is located on a sidewall of the at least one sacrificial gate structure 24, and source/drain regions 26 are located laterally adjacent to, and on each side of, the at least one sacrificial gate structure 22. The source/drain regions 26 are formed on a surface of the semiconductor channel material structure (not shown).

The exemplary structure shown in FIGS. 1A, 1B and 1C can even further include an optional buried dielectric layer 18 located beneath the source/drain regions 26. The exemplary structure can even further include an interlayer dielectric material layer 28 that is located laterally adjacent to the at least one sacrificial gate structure 24 and the source/drain regions 26. The interlayer dielectric material layer 28 can be formed above each of the source/drain regions 26 (See, FIG. 1B).

The exemplary structure shown in FIGS. 1A, 1B and 1C can be formed utilizing techniques that are well known to those skilled in the art. For example, the gate patterning, bottom dielectric isolation formation, inner spacer formation, and source/drain formation for forming a nanosheet device disclosed in U.S. Pat. No. 10,903,315 B2, the entire content and disclosure of which is incorporated herein by reference, can be used here in the present application.

In one embodiment, the exemplary structure shown in FIGS. 1A, 1B and 1C can be formed by first providing the semiconductor substrate 10. The semiconductor substrate 10 can be a bulk semiconductor substrate composed entirely of at least one of the above mentioned semiconductor materials. Alternatively, semiconductor substrate 10 is a semiconductor-insulator (SOI) substrate including a buried dielectric layer (such as, for example, silicon dioxide and/or boron nitride) sandwiched between a top semiconductor material layer and a bottom semiconductor material layer.

Next, an optional placeholder material layer (used in forming the optional buried dielectric layer 18) and a material stack including alternating layers of sacrificial semiconductor material and semiconductor channel material (in this embodiment, the sacrificial semiconductor material is composed of a semiconductor material that is compositionally different from the semiconductor channel material) are formed by first epitaxially growing a blanket layer of the optional placeholder material, followed by growing alternating blanket layers of sacrificial semiconductor material and semiconductor channel material. In one example, the blanket layer of the optional placeholder material and alternating blanket layers of sacrificial semiconductor material and semiconductor channel material can be deposited utilizing epitaxial growth. The blanket layer of the optional placeholder material and alternating blanket layers of sacrificial semiconductor material and semiconductor channel material are then patterned by lithography and etching. The etch goes through the blanket layers of optional placeholder material, alternating blanket layers of sacrificial semiconductor material and semiconductor channel material, and into a top portion of the semiconductor substrate 10.

The shallow trench isolation structure 12 can then be formed by filling an area laterally adjacent to the optional placeholder material and the material stack with a trench dielectric material such as, for example, silicon dioxide, silicon nitride, or silicon oxynitride, or a thin dielectric liner (such as for example, a silicon nitride liner, followed by a trench dielectric material (such as, for example, silicon dioxide). A planarization process (such as, for example, chemical mechanical polishing (CMP)) and/or densification process can be performed after the trench fill process. Following formation of the buried power rail 16 (to be subsequently described herein below), portions of the trench dielectric material can be recessed to provide the shallow trench isolation structure 12.

Next, the buried power rail 16 is formed by forming a buried power rail opening in the shallow trench isolation structure 12 and into the semiconductor substrate 10, and then filling the buried power rail opening with a buried dielectric material layer and a buried power rail conductive material. The buried dielectric material layer is composed of a dielectric material that is compositionally different from the dielectric material that provides the shallow trench isolation structure 12. In one embodiment, the dielectric material that provides the buried dielectric material layer is composed of a silicon nitride based dielectric material such as, for example, silicon nitride, silicon boron carbon nitride, or a dielectric including atoms of Si, O, C and N. In another embodiment, the dielectric material that provides buried dielectric material layer is composed of a silicon carbon based dielectric material such as, for example, silicon carbide or a dielectric including atoms of Si, C and O. Other dielectric materials besides a silicon nitride based dielectric and a silicon carbon based dielectric material can be used as the dielectric material that provides the buried dielectric material layer. The buried dielectric material layer does not fill the entirety of the volume of the buried power rail opening. The buried dielectric material layer can have a thickness from 2 nm to 15 nm; although other thicknesses for the buried dielectric material layer are contemplated and can be used as the thickness of the buried dielectric material layer in the present application. In some embodiments, the buried dielectric material layer is conformal layer. By "conformal layer" it is meant that a material layer has a thickness along horizontal surfaces that is the same as a thickness of the same material layer along vertical surfaces.

The buried power rail conductive material is composed of any electrically conductive power rail material including, but not limited to, tungsten (W), cobalt (Co), ruthenium (Ru), aluminum (Al), copper (Cu), platinum (Pt), rhodium (Rh), or palladium (Pd), with a thin metal adhesion layer (such as TiN, TaN) typically being formed prior to the conductive metal deposition; for clarity, the metal adhesion layer is not separately illustrated in the drawings of the present application. The buried power rail conductive material is formed on the buried power rail dielectric material layer and fills in the remaining the volume of the buried power rail opening.

The buried power rail dielectric material layer can be formed by depositing a buried power rail dielectric material inside and outside of the buried power rail opening. Exemplary deposition processes include, but are not limited to, chemical vapor deposition (CVD), plasma enhanced chemical vapor deposition (PECVD), physical vapor deposition (PVD), atomic layer deposition (ALD). Next, the buried power rail conductive material is deposited on buried power rail dielectric material layer that is present inside and outside of the buried power rail opening. Exemplary deposition processes that can be used to form the buried power rail conductive material include, but are not limited to, CVD, PECVD, PVD, sputtering or platting. After depositing the buried power rail dielectric material layer and the buried power rail conductive material, a planarization process such as, for example, (CMP), can be used to remove the buried power rail dielectric material layer and the buried power rail conductive material that are present outside of the buried power rail opening. A portion of the buried power rail dielectric material layer and the buried power rail conductive material remain in the buried power rail opening. A recess etch is then performed to provide the buried power rail dielectric material liner 14 and the buried power rail 16. Typically, and as shown in FIG. 1B, the buried power rail dielectric material liner 14 is U-shaped and has a topmost surface that is coplanar with a top surface of the buried power rail 16.

Next, the at least one sacrificial gate structure 24 is formed and thereafter the dielectric spacer 22 is formed. The at least one sacrificial gate structure 24 can be formed by depositing blanket layers of an optional sacrificial gate dielectric material (such as, for example, silicon dioxide), a sacrificial gate material (such as, for example, polysilicon or a metal), and an optional sacrificial gate cap (composed of a dielectric hard mask material such as, for example, silicon nitride). The depositing of the blanket layers of optional sacrificial gate dielectric material, sacrificial gate material, and optional sacrificial gate cap includes, but is not limited to, CVD, PECVD, PVD, ALD or any combination of such deposition processes. After forming the blanket layers of optional sacrificial gate dielectric material, sacrificial gate material, and optional sacrificial gate cap, a patterning process (including lithography and etching) is used to convert the blanket layers of optional sacrificial gate dielectric material, sacrificial gate material, and optional sacrificial gate cap into the at least one sacrificial gate structure 24.

After forming the at least one sacrificial gate structure 24, the optional placeholder material layer is selectively removed forming a void at the bottom of the material stack. Next, a conformal dielectric spacer 22 is then formed by deposition of a dielectric spacer material, followed by a spacer etch. The dielectric spacer material that provides dielectric spacer 22 can include silicon dioxide or silicon nitride. The dielectric spacer 22 will also fill the void at bottom of the material stack forming a bottom dielectric isolation layer 18.

After those processing steps, the material stack is patterned utilizing the sacrificial gate structure 24 and the dielectric spacer 22 as an etch mask. The patterning includes an etching process which removes physically exposed portions of the material stack not protected by the etch mask, while maintaining a portion of the material stack beneath the etch mask. The maintained portion of the material stack that is located beneath the etch mask is a nanosheet stack of alternating nanosheets of sacrificial semiconductor material (not shown) and semiconductor channel material (not shown). The etch stops of the on the bottom dielectric isolation layer 18, if optional placeholder material layer is present, or on a surface of the semiconductor substrate 10, if the optional placeholder material layer is not present.

After defining the nanosheet stack of alternating nanosheets of sacrificial semiconductor material (not shown) and semiconductor channel material (not shown), end portions of the each sacrificial semiconductor material nanosheet are recessed to form a gap (not show). The recessing includes a lateral etching process. An inner spacer (not shown) is then formed in the gap created by the recessing of each sacrificial semiconductor nanosheet. The forming of the inner spacer includes conformal deposition of another dielectric spacer material, followed by an isotropic etch. The another dielectric spacer material can be compositionally the same as, or compositionally, different from the dielectric spacer material that provides dielectric spacer 22.

After inner spacer formation, source/drain regions 26 are formed. As used herein, a "source/drain" region can be a source region or a drain region depending on subsequent wiring and application of voltages during operation of the FET. The source/drain regions 26 have a sidewall that is in direct physical contact with the outermost sidewalls of each semiconductor channel material nanosheet. The source/drain regions 26 comprise a semiconductor material and a dopant. The semiconductor material that provides each source/drain region 26 can include one of the semiconductor materials mentioned above for the semiconductor substrate 10. The semiconductor material that provides the source/drain regions 26 can be compositionally the same, or compositionally different from each semiconductor channel material nanosheet. The semiconductor material that provides the source/drain regions 26 is however compositionally different from each recessed sacrificial semiconductor material nanosheet.

The dopant that is present in each source/drain region 26 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium, and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one example, each source/drain region 26 can have a dopant concentration of from $4\times10^{20}$ atoms/cm$^3$ to $3\times10^{21}$ atoms/cm$^3$. In one example, each bottom source/drain region 26 is composed of phosphorus doped silicon.

Each source/drain region 26 can be formed by an epitaxial growth in which the dopants are present during the epitaxial growth process. The source/drain regions 36 grow laterally outward from each semiconductor channel material nanosheet. A recess etch can be optionally employed so as to reduce the height of each of the source/drain regions 26.

After source/drain region 26 formation, interlayer dielectric (ILD) material layer 28 is formed. The ILD material layer 28 can be composed of a dielectric material including, for example, silicon oxide, silicon nitride, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. Although not shown, the ILD material layer 28 can include a multilayered structure that includes at least two different dielectric materials stacked one atop the other such as, for example, silicon nitride and silicon dioxide. The ILD material layer 28 can be formed by a deposition process such as, for example, CVD, PECVD, or spin-on coating. A planarization process can be performed after the deposition of the dielectric material that provides the ILD material layer 28; this planarization process physically exposes a topmost surface of each sacrificial gate structure 24.

It is noted that although the above description illustrates the formation of a nanosheet stack in the exemplary structure shown in FIGS. 1A, 1B and 1C, the processing steps mentioned above can be changed to accommodate embodiments in which other types of semiconductor channel material structures are employed. Such changes to the processing steps would be known to one skilled in the art.

Figure 2A:
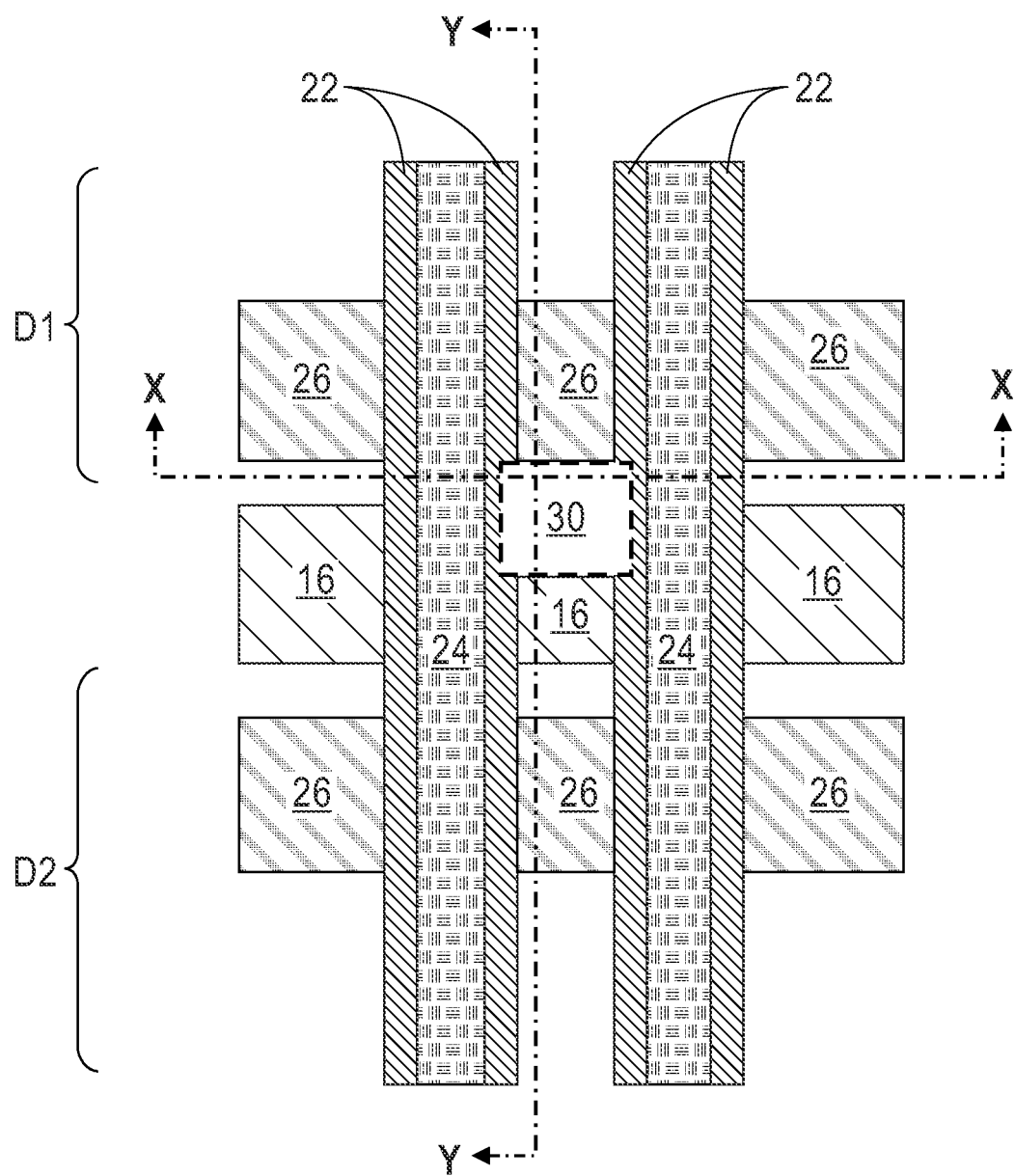
FIGS. 2A, 2B and 2C are various views of the exemplary structure shown in FIGS. 1A, 1B and 1C, respectively, after forming a VBPR contact structure opening.
Figure 2C:
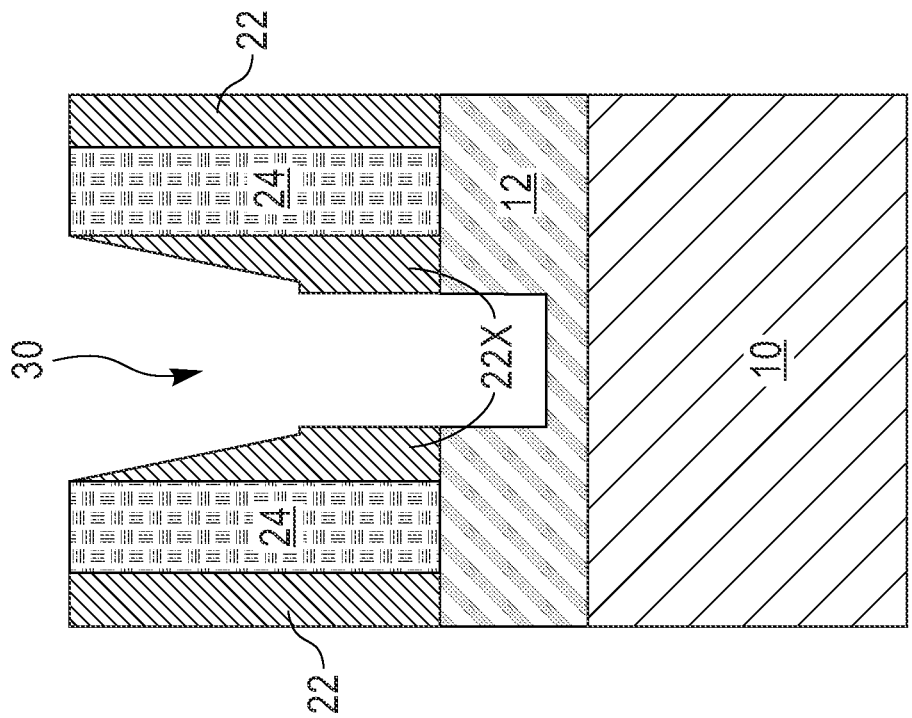
Figure 2B:
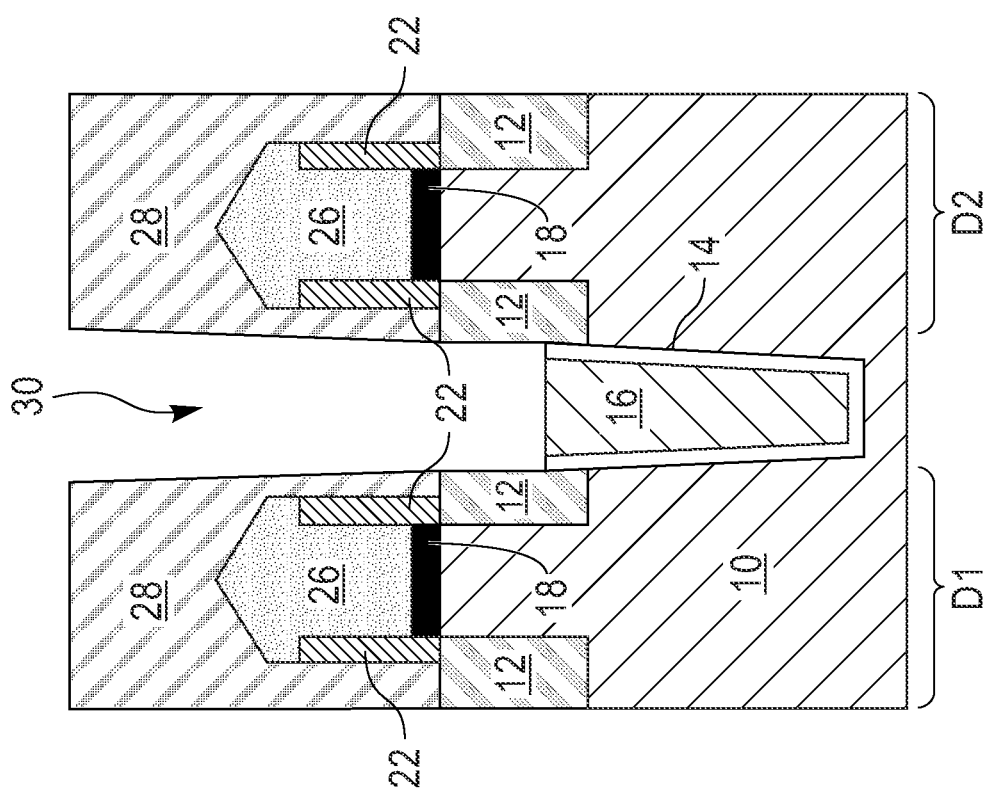

Referring now to FIGS. 2A, 2B and 2C, there are illustrated the exemplary structure shown in FIGS. 1A, 1B and 1C, respectively, after forming a VBPR contact structure opening 30. The VBPR contact structure opening 30 is formed on at least one side of the sacrificial gate structure 24 and in the region including the shallow trench isolation structure 12 and the buried power rail 16. The VBPR contact structure opening 30 is formed through the ILD material layer 28 and into the shallow trench isolation structure 12 so as to physically expose a surface of at least the buried power rail 16; a surface of the buried power rail dielectric material liner 14 can also be physically exposed by the VBPR contact structure opening 30. The VBPR contact structure opening 30 can be formed lithography and etching. The etch used in forming the VBPR contact opening 30 can include a reactive ion etch (RIE). The etch used in forming the VBPR contact structure opening 30 typically removes an entirety of the ILD material layer 28 that is located laterally adjacent to the at least one sacrificial gate structure 24 and damages the dielectric spacer 22 forming a damaged dielectric spacer 22X as shown in FIG. 2C. The damaged dielectric spacer 22X has an upper portion that is undesirable removed by the etch used to form the VBPR contact structure opening 30. The damaged dielectric spacer 22X has an upper portion having a width that is less than a lower portion of the damaged dielectric spacer 22X. This damaged portion of the dielectric spacer causes VBPR contact structure to gate-end shorts. In embodiments in which a backside power rail is used, the VBPR contact formed at this step still etches through the ILD material layer 28 and the shallow trench isolation structure 12, however, it does not land over any power rail structure, and the backside power rail will be formed later to connect to VBPR from a backside of the wafer as shown in FIGS. 15A-15B.

Figure 3A:
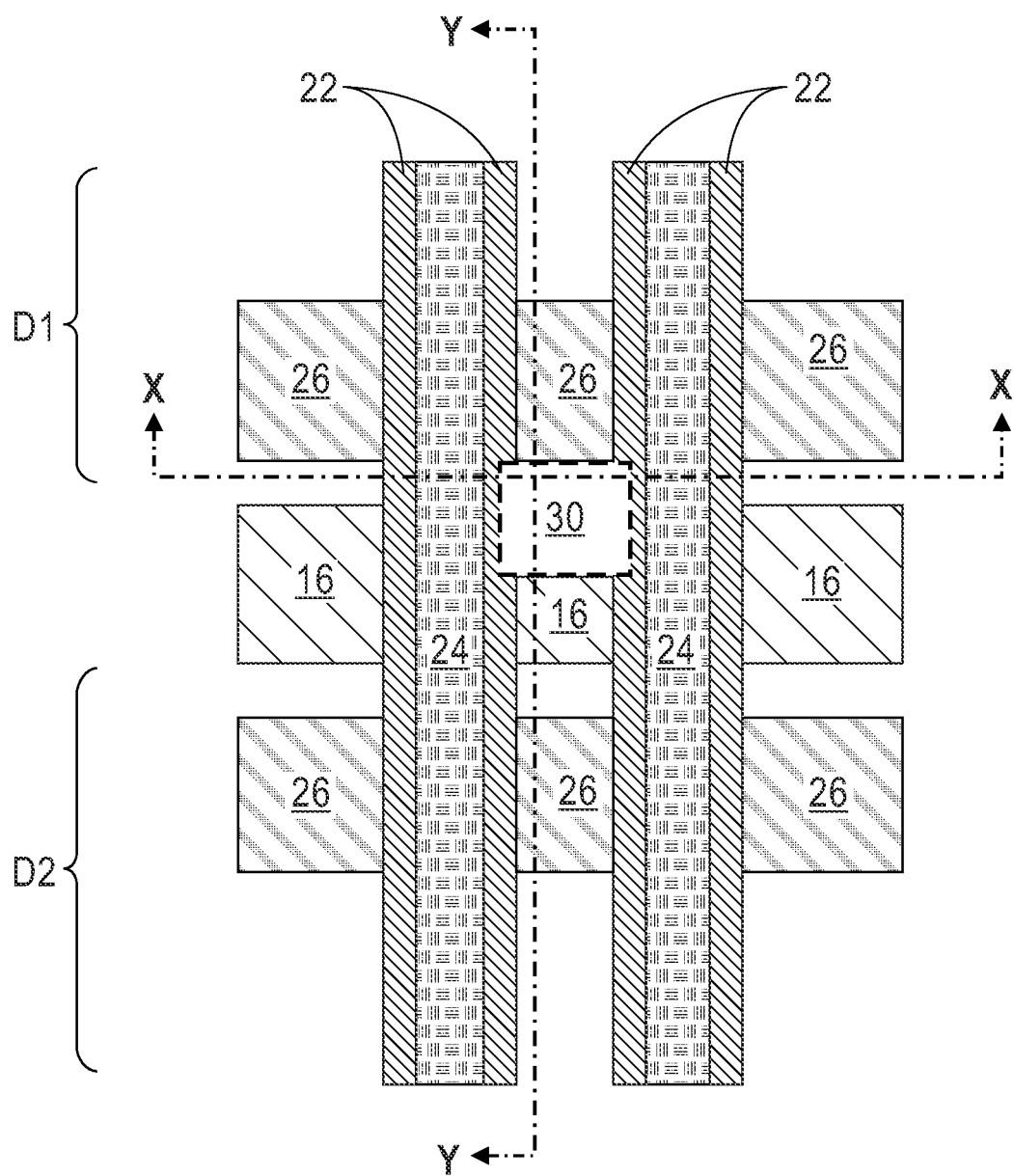
FIGS. 3A, 3B and 3C are various views of the exemplary structure shown in FIGS. 2A, 2B and 2C, respectively, after forming a sacrificial material structure in a lower portion of the VBPR contact structure opening.
Figure 3C:
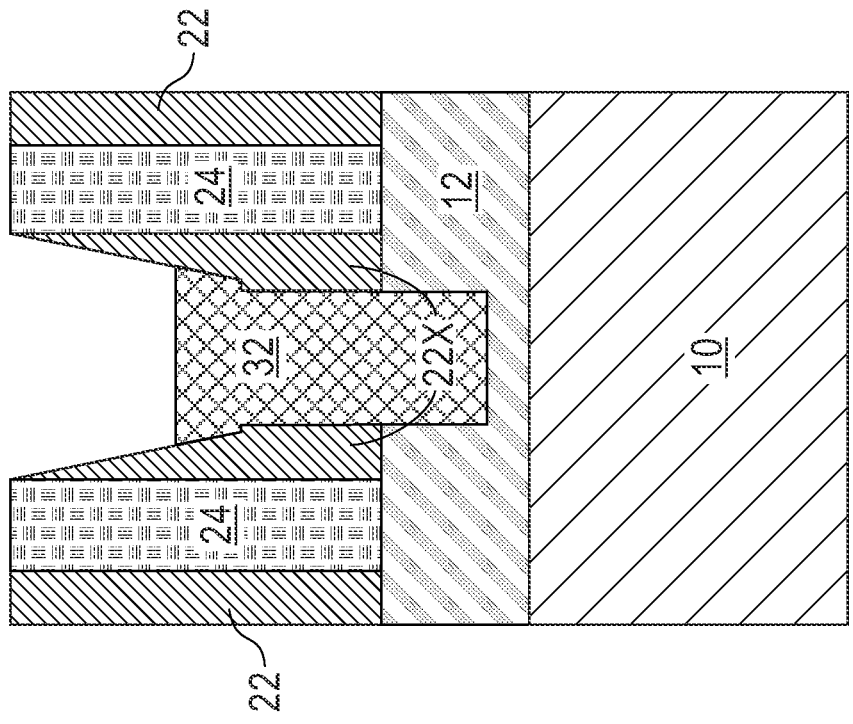
Figure 3B:
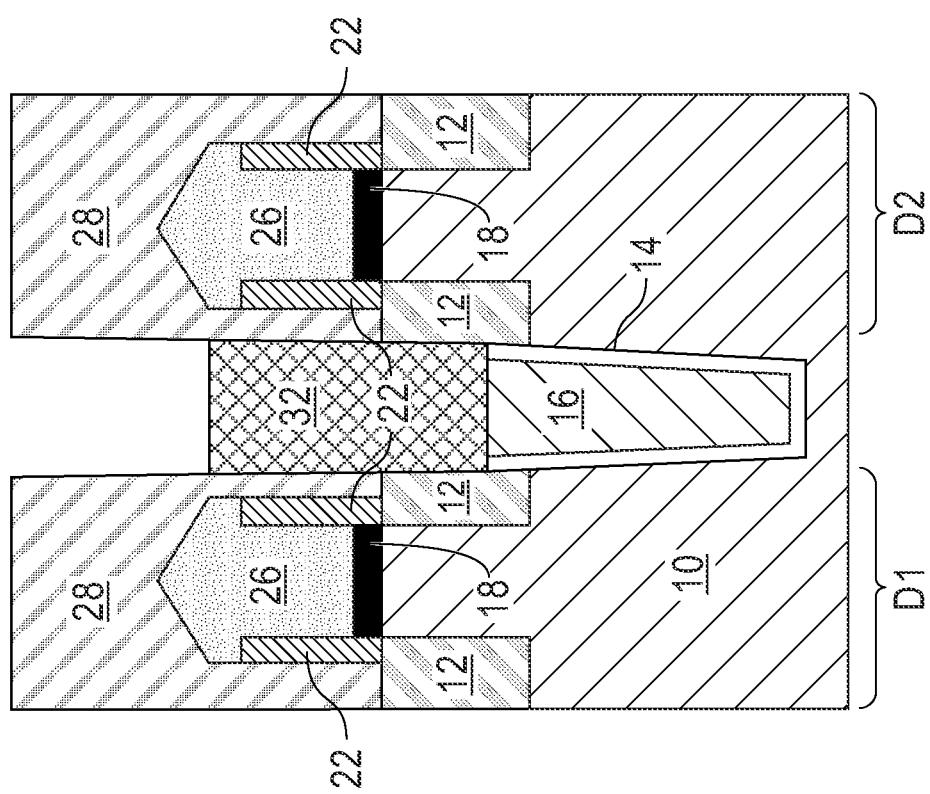

Referring now to FIGS. 3A, 3B and 3C, there are illustrated the exemplary structure shown in FIGS. 2A, 2B and 2C, respectively, after forming a sacrificial material structure 32 in a lower portion of the VBPR contact structure opening 30. The sacrificial material structure 32 is formed on the physically exposed surface of at least the buried power rail 16; if the buried power rail dielectric liner 14 is physically exposed, the sacrificial material structure 32 is also formed on the physically exposed surface of the buried power rail dielectric liner 14.

The sacrificial material structure 32 is composed of a sacrificial material that is compositionally different from at least the buried power rail 16. Illustrative examples of sacrificial materials that can be used as the sacrificial material structure 32 include, but are not limited to, titanium dioxide, aluminum oxide (AlOx), amorphous silicon germanium (a-SiGe), or amorphous germanium (a-Ge). The sacrificial material structure 32 can be formed by filling the VBPR contact structure opening 30 with a sacrificial material and thereafter recessing the sacrificial material. The filling of the VBPR contact structure opening 30 with the sacrificial material can include a deposition process such as, for example, CVD, PECVD, PVD or ALD. The recessing of the sacrificial material can include an etch that is selective in removing an upper portion of the sacrificial material from the VBPR contact structure opening 30. A lower portion of the sacrificial material remains in the VBPR contact structure opening 30 after this recess etch. The remaining lower portion of the sacrificial material provides the sacrificial material structure 32. The sacrificial material structure 32 covers a lower portion of the damaged dielectric spacer 22X, while leaving the upper portion of the damaged dielectric spacer 22X having the reduced width physically exposed.

Figure 4A:
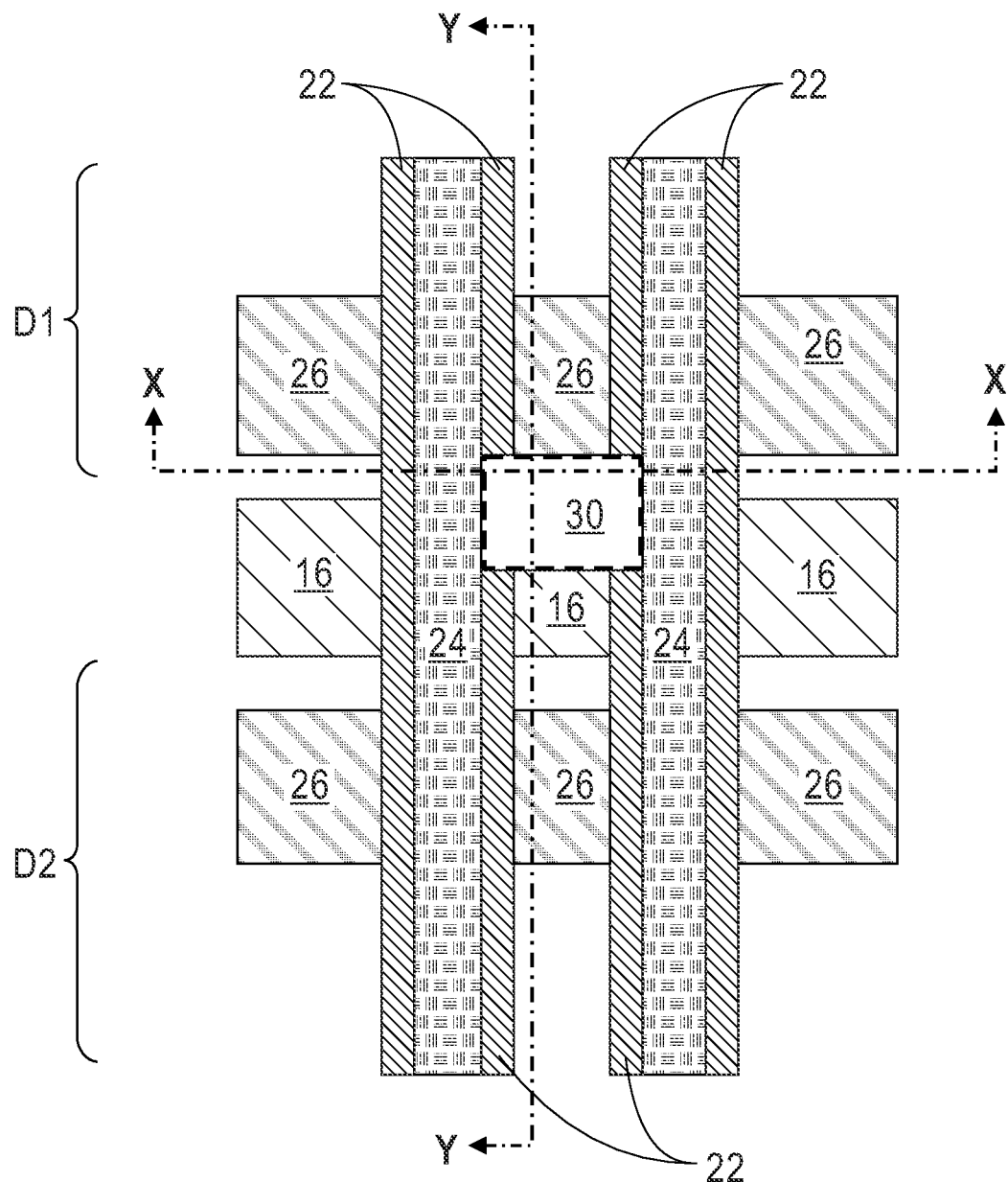

Referring now to FIGS. 4A, 4B and 4C, there are illustrated the exemplary structure shown in FIGS. 3A, 3B and 3C, respectively, after removing a physically exposed upper portion of the damaged dielectric spacer 22X, while maintaining a lower portion of the damaged dielectric spacer 22X (hereinafter base dielectric spacer 22L) laterally adjacent to the sacrificial material structure 32. The removal of the physically exposed upper portion of the damaged dielectric spacer 22X can be performed utilizing an etching process that is selective in removing a dielectric spacer material. In one example, the etching process that removes the physically exposed upper portion of the damaged dielectric spacer 22X includes a selective dry etch process or a selective wet etch process. The base dielectric spacer 22L has a first sidewall portion S1 distal to the sacrificial gate structure 24 that is perpendicular relative to a horizontal topmost surface of the shallow trench isolation structure 12 and a second sidewall portion S2 distal to the sacrificial gate structure 24 that is tapered relative to the first sidewall portion S1. At this point of the present application, the base dielectric spacer 22L has a topmost surface that is coplanar with a topmost surface of the sacrificial material structure 32.

Figure 5A:
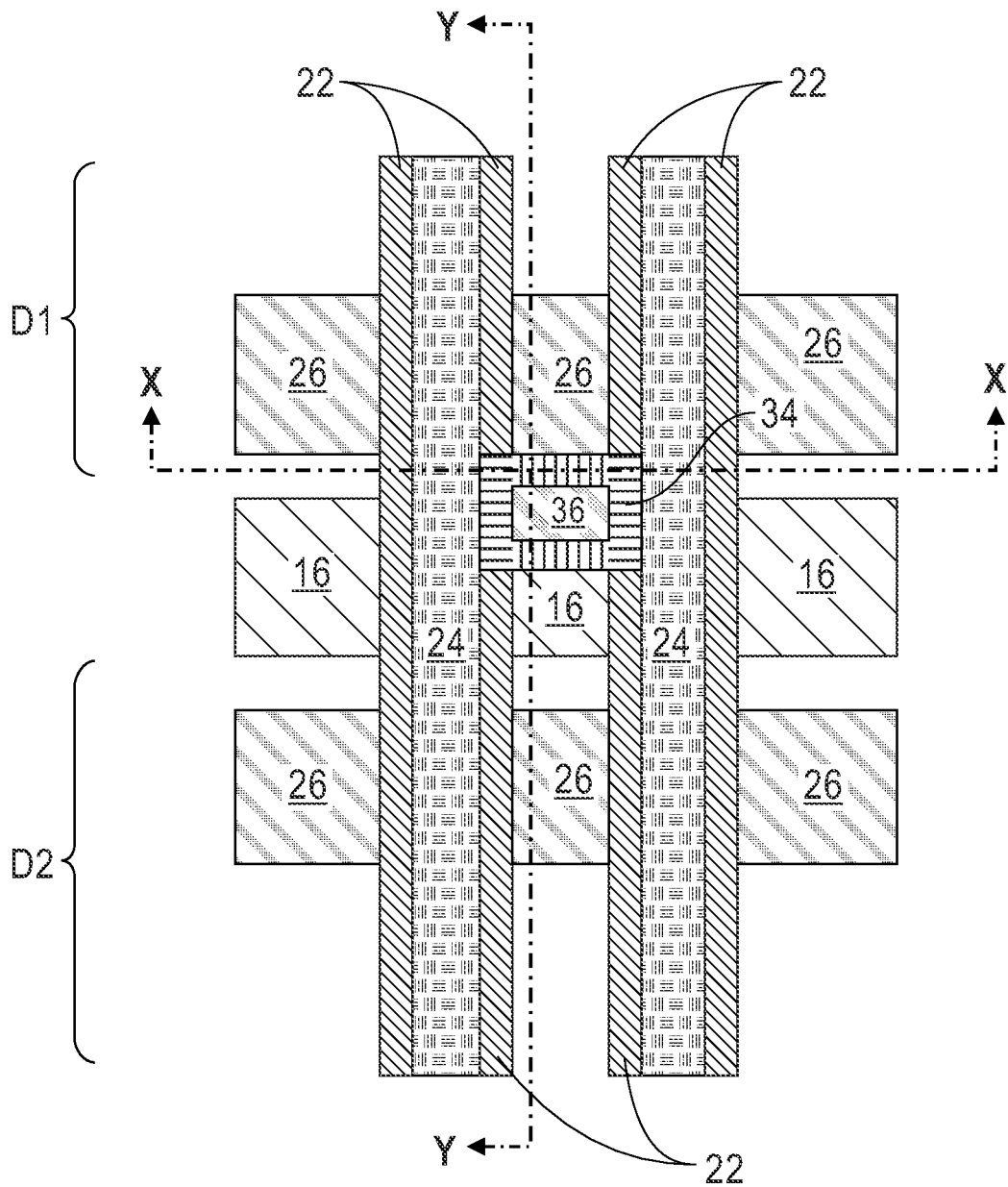
FIGS. 5A, 5B and 5C are various views of the exemplary structure shown in FIGS. 4A, 4B and 4C, respectively, after forming a bilayer dielectric cap structure in the VBPR contact structure opening and on a topmost surface of the sacrificial material structure and the base dielectric spacer, wherein the bilayer dielectric cap structure includes an outer dielectric material layer located laterally adjacent to, and surrounding, an inner dielectric material layer.
Figure 5C:
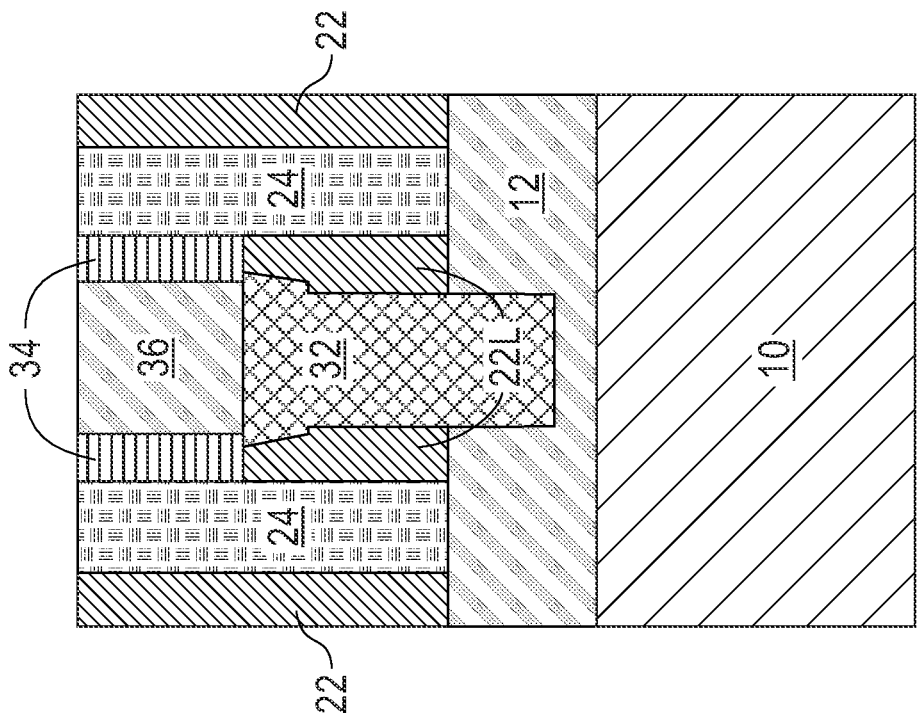
Figure 5B:
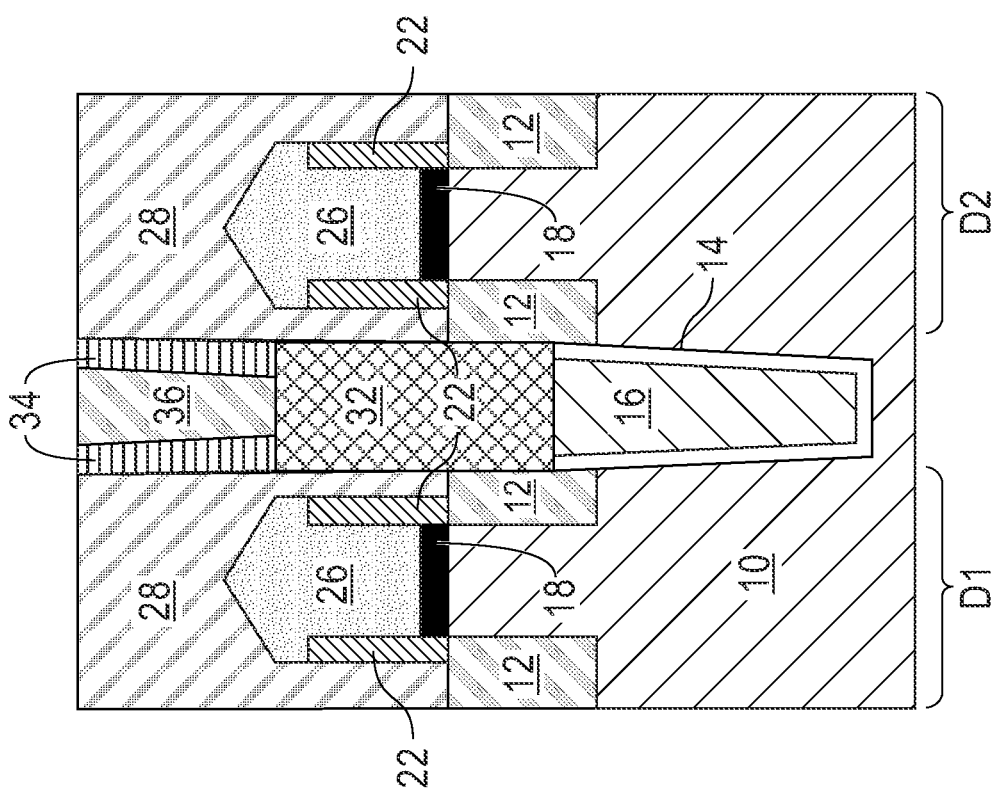

Referring now to FIGS. 5A, 5B and 5C, there are illustrated the exemplary structure shown in FIGS. 4A, 4B and 4C, respectively, after forming a bilayer dielectric cap structure in the VBPR contact structure opening 30 and on a topmost surface of the sacrificial material structure 32 and the base dielectric spacer 22L. The bilayer dielectric cap structure of the present application includes an outer dielectric material layer 34 located laterally adjacent to, and surrounding, an inner dielectric material layer 36.

In the present application, the outer dielectric material layer 34 is composed of a first dielectric material that is compositionally different from a second dielectric material that provides the inner dielectric material layer 36. The first and second dielectric materials that provide the outer dielectric material layer 34 and the inner dielectric material layer 36, respectively, can include a silicon nitride based dielectric material such as, for example, silicon nitride, silicon boron carbon nitride, or a dielectric including atoms of Si, O, C and N, a silicon carbon based dielectric material such as, for example, silicon carbide or a dielectric including atoms of Si, C and O, or any other dielectric material such as, for example, silicon dioxide. In one example, outer dielectric material layer 34 is composed of a dielectric including atoms of Si, C and O or silicon carbide, and the inner dielectric material layer 36 is composed of silicon dioxide.

The bilayer dielectric cap structure can be formed by first depositing a blanket layer of the first dielectric material in the VBPR contact structure opening 30 and on a topmost surface of the sacrificial material structure 32 and the base dielectric spacer 22L, followed by an anisotropic etch, and then the remaining volume of the VBPR contact structure opening 30 is then filled with the second dielectric material. A planarization process can be used to remove the first and second dielectric materials that are formed outside the VBPR contact structure opening 30. The remaining first dielectric material in the VBPR contact structure opening 30 provides the outer dielectric material layer 34, and the remaining second dielectric material in the VBPR contact structure opening 30 forms the inner dielectric material layer 36. The bilayer dielectric cap structure including the outer dielectric material layer 34 and the inner dielectric material layer 36 has a topmost surface that is coplanar with the at least one sacrificial gate structure 24, the dielectric spacer 22 that is located on a side of the at least one functional gate structure 14 opposite the side include the VBPR contact structure opening 30, and the ILD material layer 28.

Figure 6A:
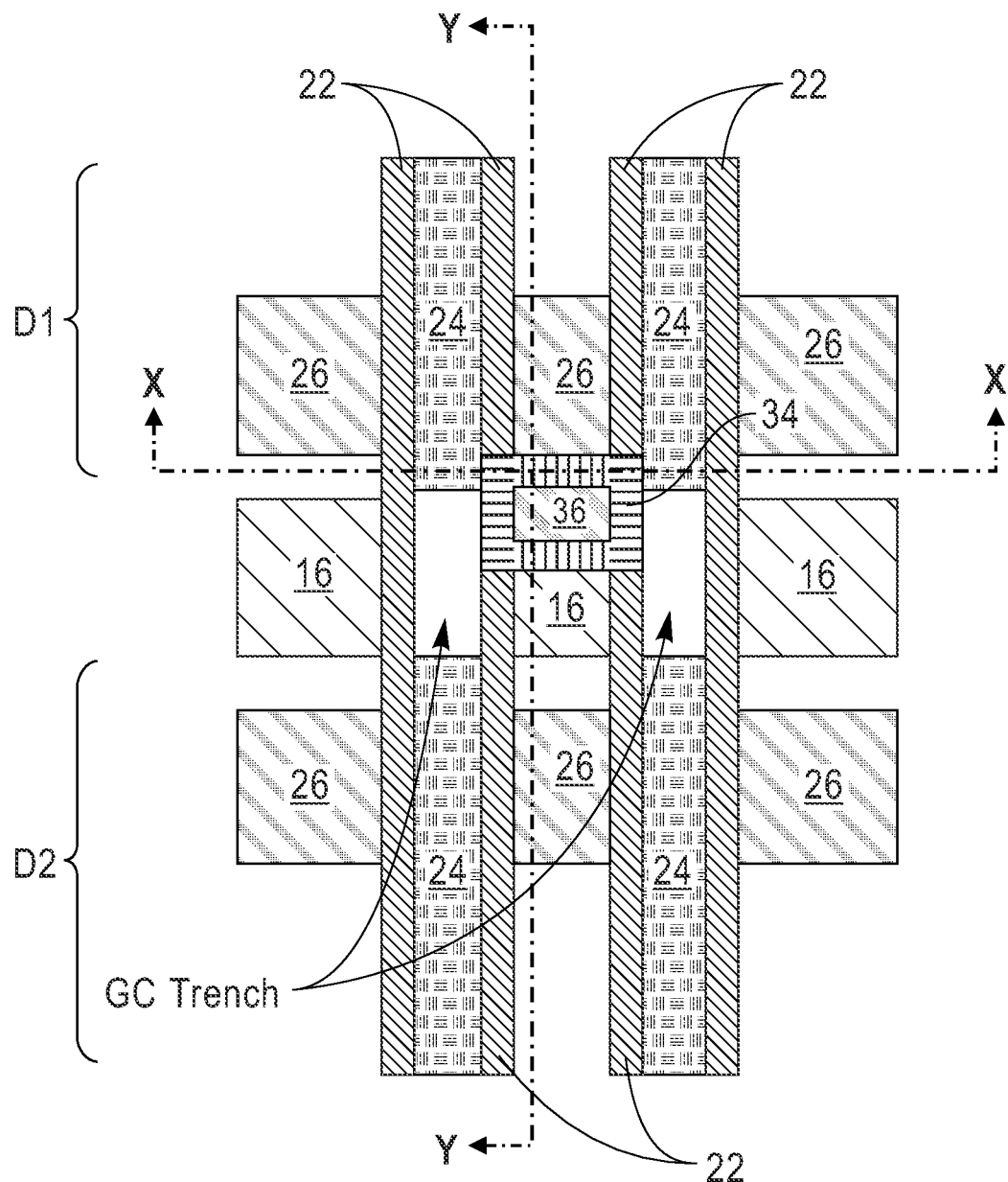
FIGS. 6A, 6B and 6C are various views of the exemplary structure shown in FIGS. 5A, 5B and 5C, respectively, after performing a gate cut process to remove the at least one sacrificial gate structure from the region including the shallow trench isolation structure and to provide a gate cut trench.
Figure 6C:
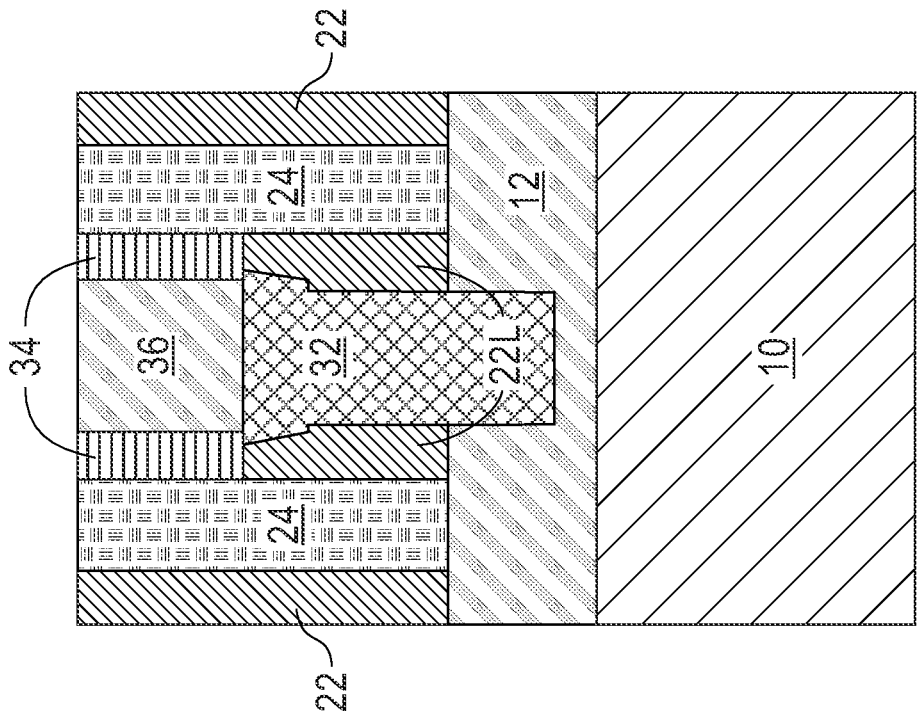
Figure 6B:
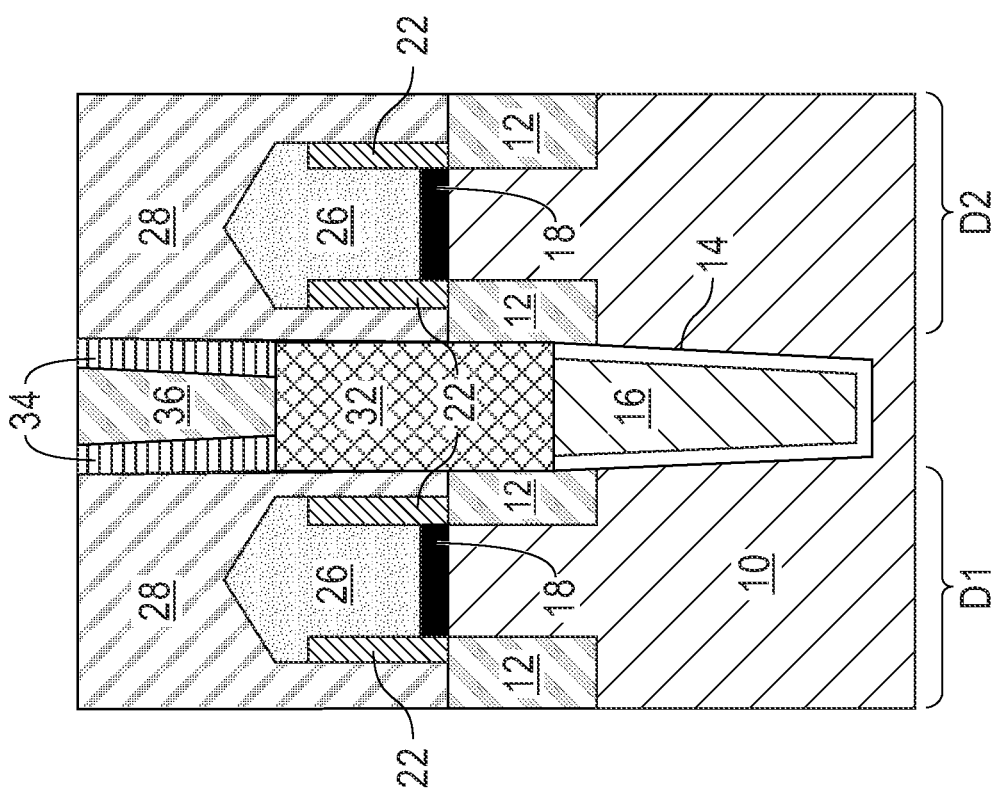

Referring now to FIGS. 6A, 6B and 6C, there are illustrated the exemplary structure shown in FIGS. 5A, 5B and 5C, respectively, after performing a gate cut process to remove the at least one sacrificial gate structure 24 from the region including the shallow trench isolation structure 12 and to provide a gate cut trench, GC Trench. As is shown, the at least one sacrificial gate structure 24 is cut so that the sacrificial gate structure 24 is no longer a continuous sacrificial gate structure 24. Instead, individual sacrificial gate structures 24 remain in the first device region D1 and the second device region D2. As illustrated in FIG. 6A, ends (i.e., end walls) of the individual sacrificial gate structures 24 in the first device region D1 face ends (i.e., end walls) of the individual sacrificial gate structures 24 in the second device region D2. The ends (i.e., end walls) of the individual sacrificial gate structures run along a width wise direction of the gate structures. The gate cut process includes forming a gate cut masking layer (not shown) over the exemplary structure shown in FIGS. 5A, 5B and 5C. The gate cut masking layer has at least one opening that corresponds to a region in which a gate cut trench is to be subsequently formed. With the gate cut masking layer in place, an etch is used to remove physically exposed portion of the sacrificial gate structure 24 and to provide the gate cut trench, GC Trench, shown in FIG. 6A. After etching, the gate cut masking layer is removed.

Figure 7A:
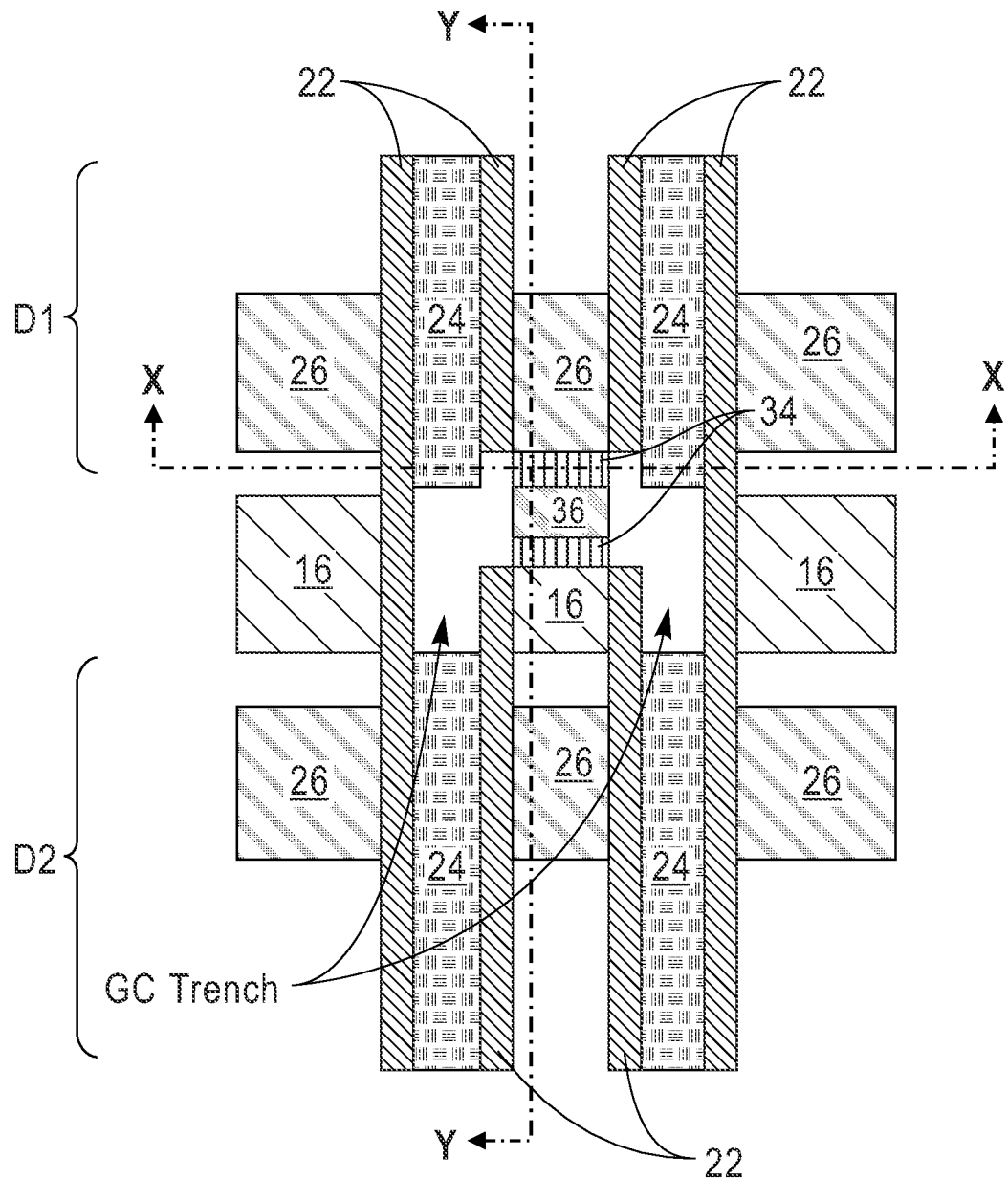
FIGS. 7A, 7B and 7C are various views of the exemplary structure shown in FIGS. 6A, 6B and 6C, respectively, after performing an etch that is selective in removing the outer dielectric material layer.
Figure 7C:
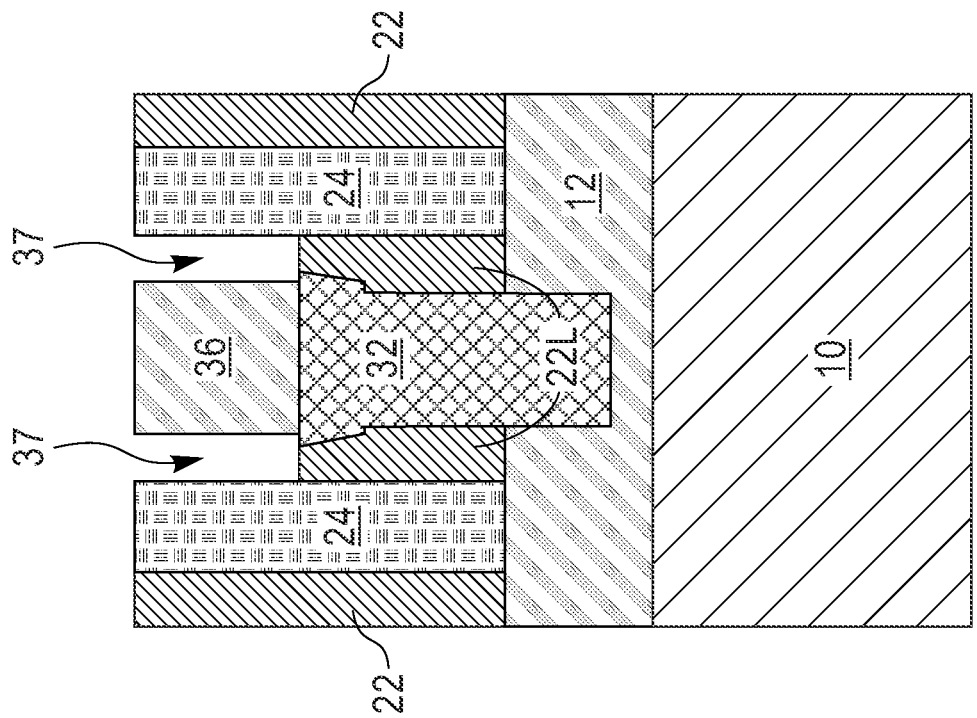
Figure 7B:
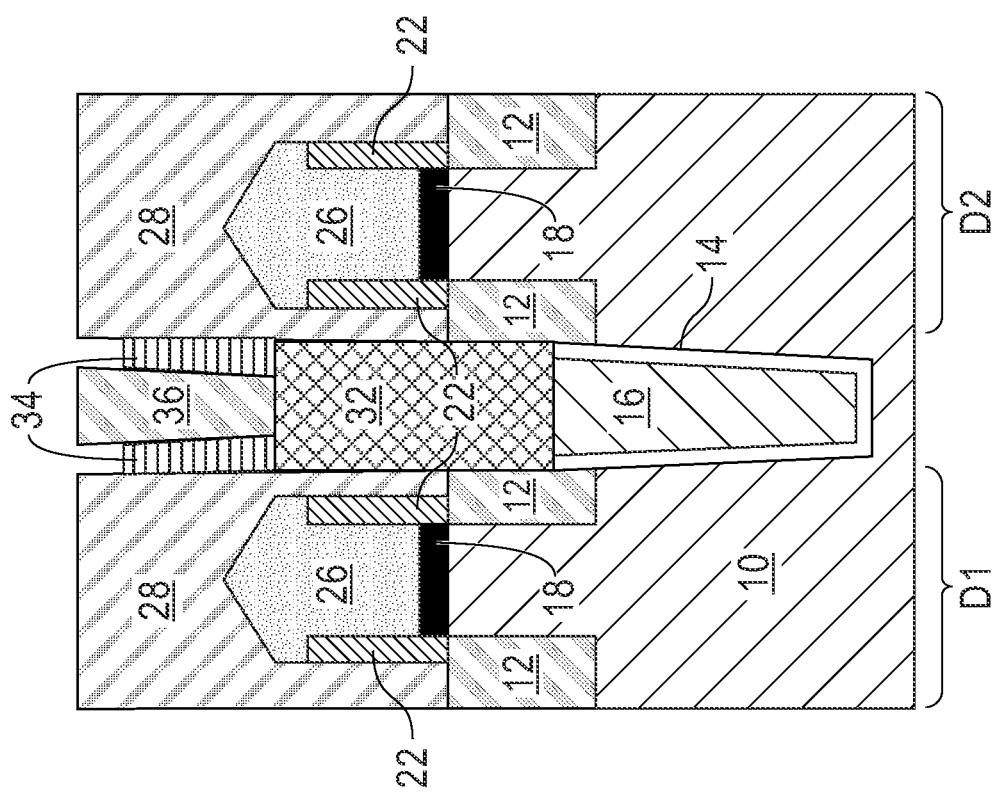

Referring now to FIGS. 7A, 7B and 7C, there are illustrated the exemplary structure shown in FIGS. 6A, 6B and 6C, respectively, after performing an etch that is selective in removing the outer dielectric material layer 34 from atop the base dielectric spacer 22L so as to physically expose the base dielectric spacer 22L in the VBPR contact structure opening 30. Note that in other areas of the structure this etch merely recesses the outer dielectric material layer 34 (See, FIG. 7B for example).

Figure 8A:
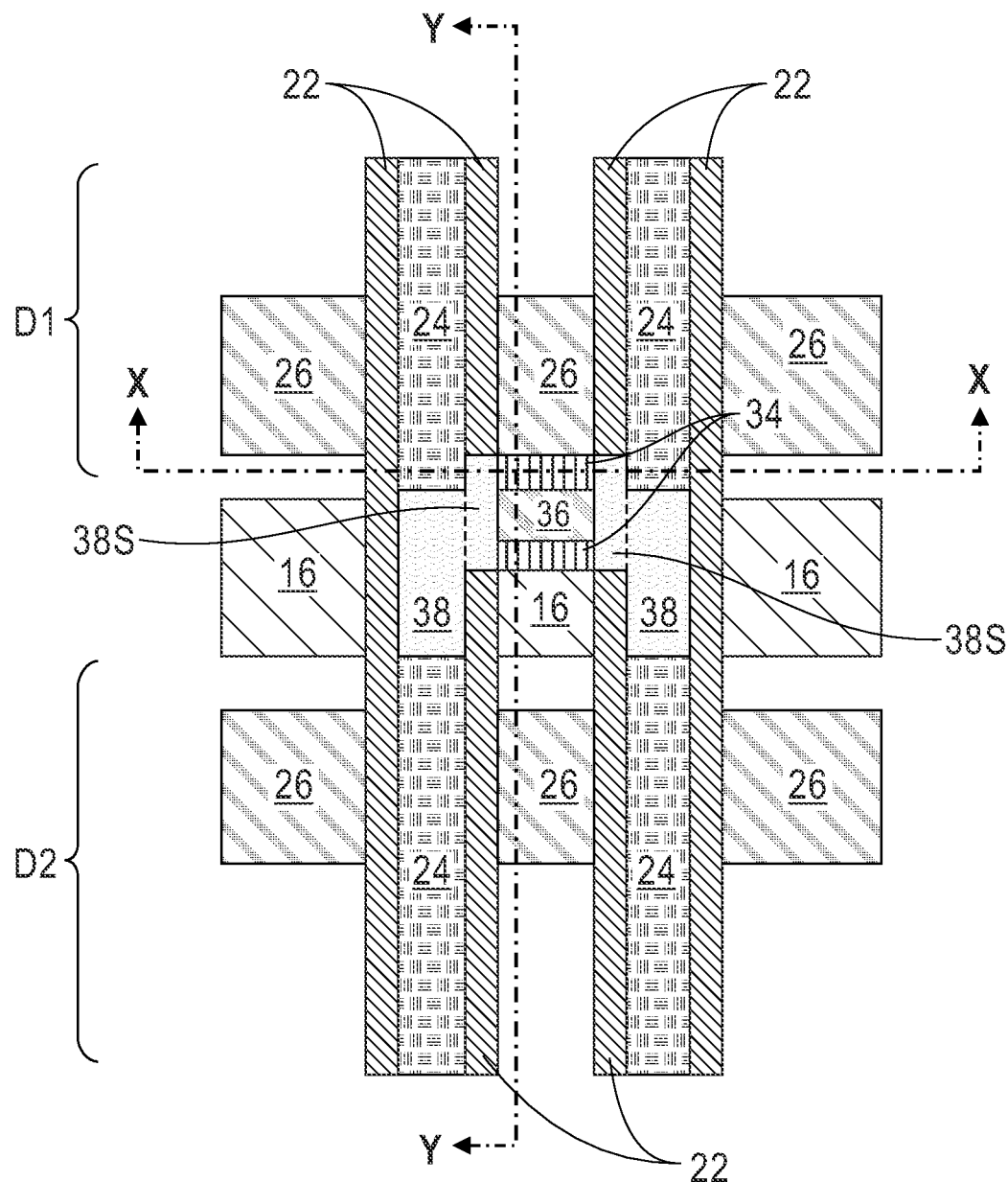
FIGS. 8A, 8B and 8C are various views of the exemplary structure shown in FIGS. 7A, 7B and 7C, respectively, after forming a gate cut dielectric material in the gate cut trench, wherein a portion of the gate cut dielectric material forms a replacement dielectric spacer, wherein the replacement dielectric spacer is located on the base dielectric spacer.
Figure 8C:
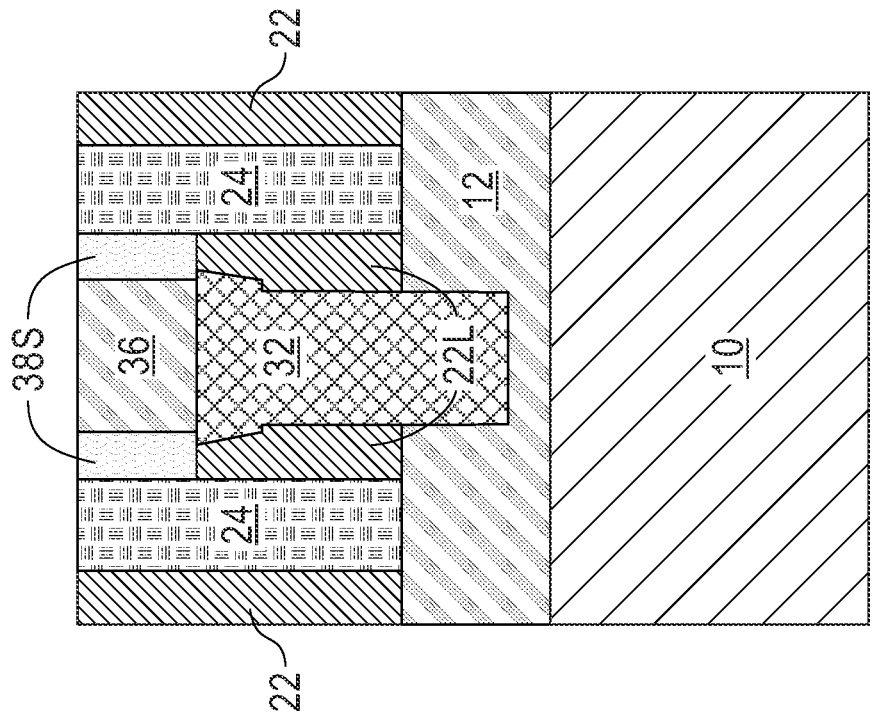
Figure 8B:
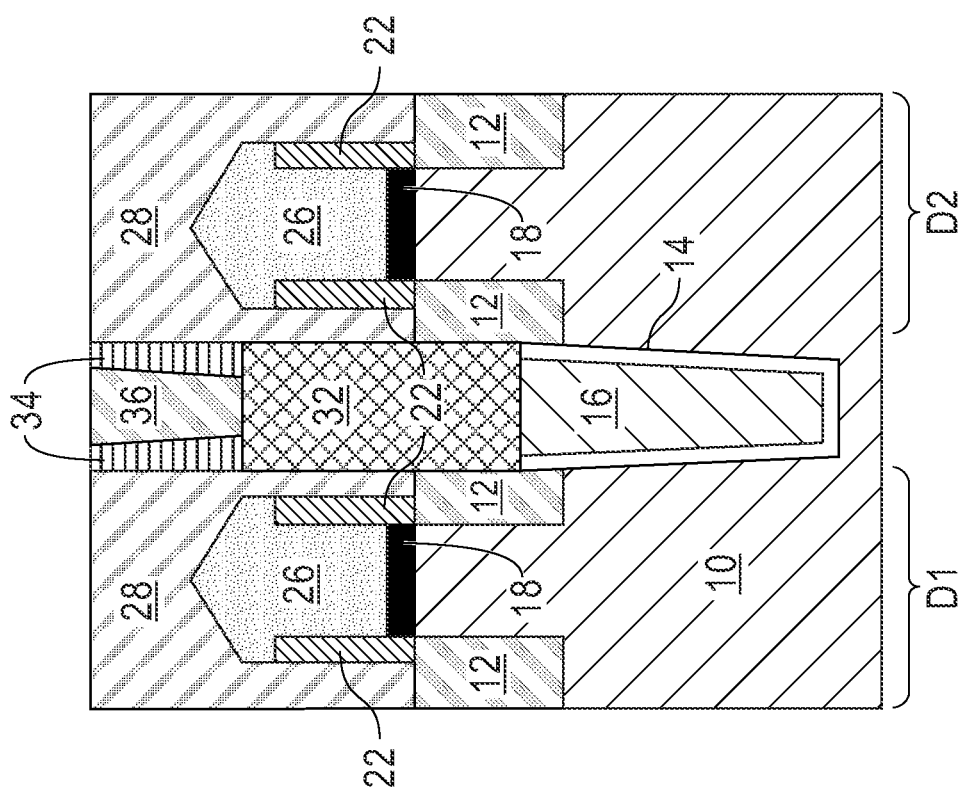

Referring now to FIGS. 8A, 8B and 8C, there are illustrated the exemplary structure shown in FIGS. 7A, 7B and 7C, respectively, after forming a gate cut dielectric material 38 in the gate cut trench, GC Trench, wherein a portion of the gate cut dielectric material forms a replacement dielectric spacer 38S, wherein the replacement dielectric spacer 38S is located on the base dielectric spacers 22L. In the top down view illustrated in FIG. 8A a dotted line is shown to distinguish the gate cut dielectric material 38 from the replacement dielectric spacer 38S. It is noted that the gate cut dielectric material 38 and the replacement dielectric spacer 38S form a contiguous, uniform structure. The gate cut dielectric material 38 and the replacement dielectric spacer 38S are both composed of a dielectric material (i.e., spacer dielectric material) that is typically, but not necessarily always, compositionally different from the dielectric spacer material that provides the outer dielectric material layer 34 and the inner dielectric material layer 36 in the VBPR contact structure opening 30. In one embodiment of the present application, the dielectric material that provides the gate cut dielectric material 38 and the replacement dielectric spacer 38S is composed of silicon nitride, and the inner dielectric material layer 36 is composed of SiC, and outer dielectric material layer 24 is composed of silicon dioxide. Note that the dielectric spacer loss caused by the VBPR opening 30 formation and removal of the damaged portion of dielectric spacer 22 has been recovered by this step of the present application. The dielectric material that provides the gate cut dielectric material 38 and the replacement dielectric spacer 38S can be formed utilizing a deposition process such as, for example, ALD, CVD or PECVD. A planarization process such as, for example, CMP can follow the deposition of the dielectric material that provides the gate cut dielectric material 38 and the replacement dielectric spacer 38S. The gate cut dielectric material 38 has a topmost surface that is coplanar with a topmost surface of the replacement dielectric spacer 38S as well as topmost surfaces of each of the inner dielectric material layer 36, the sacrificial gate structures 24, the ILD material layer 28 and the dielectric spacer 22 that is located on the opposite side of the sacrificial gate structures 24 than the side facing the VBPR opening 30.

Figure 9A:
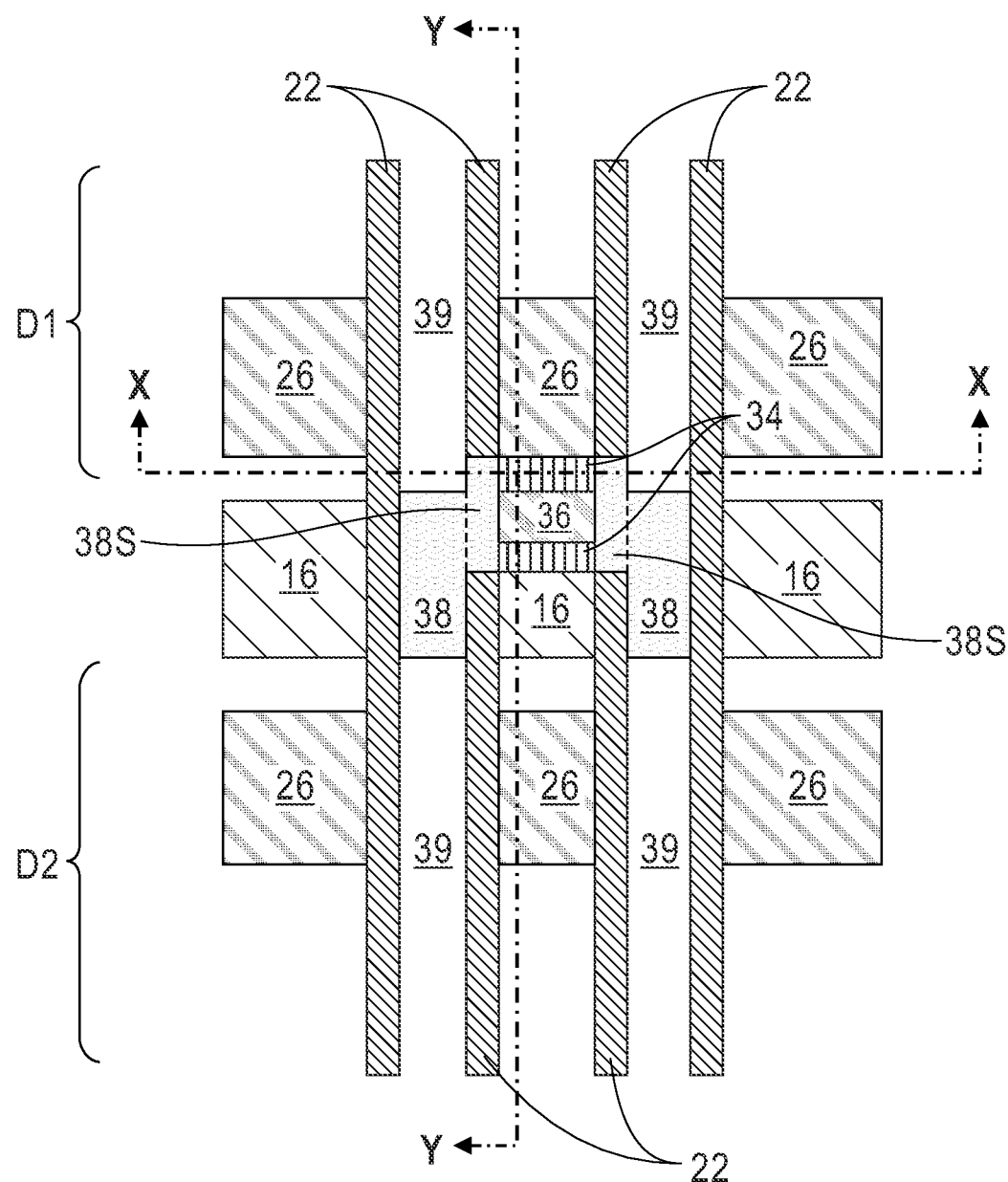
FIGS. 9A, 9B and 9C are various views of the exemplary structure shown in FIGS. 8A, 8B and 8C, respectively, after removing the remaining sacrificial gate structure present in the first device region and the second device region.
Figure 9C:
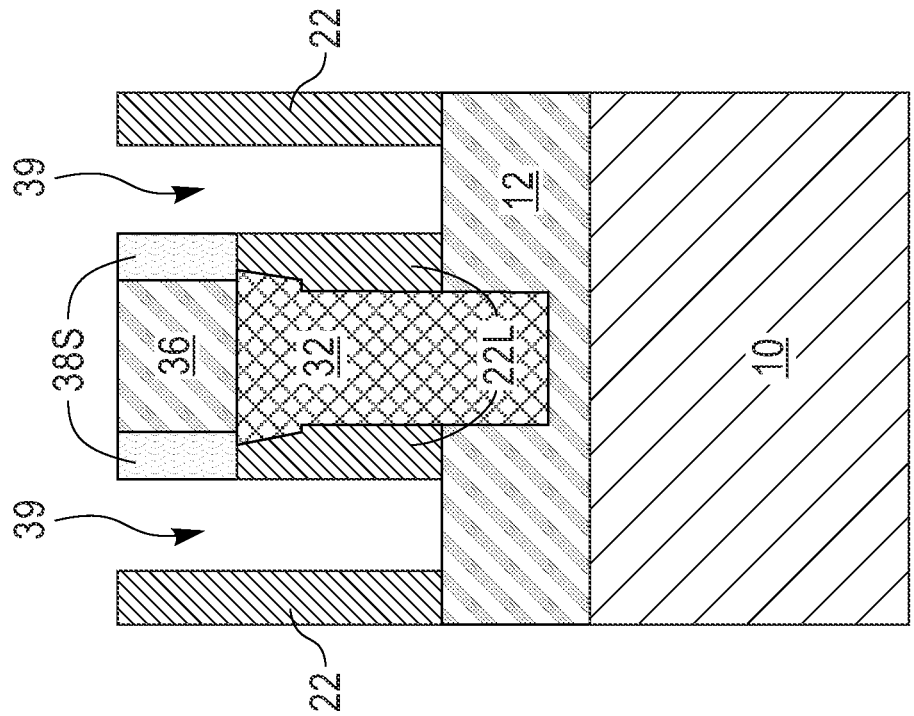
Figure 9B:
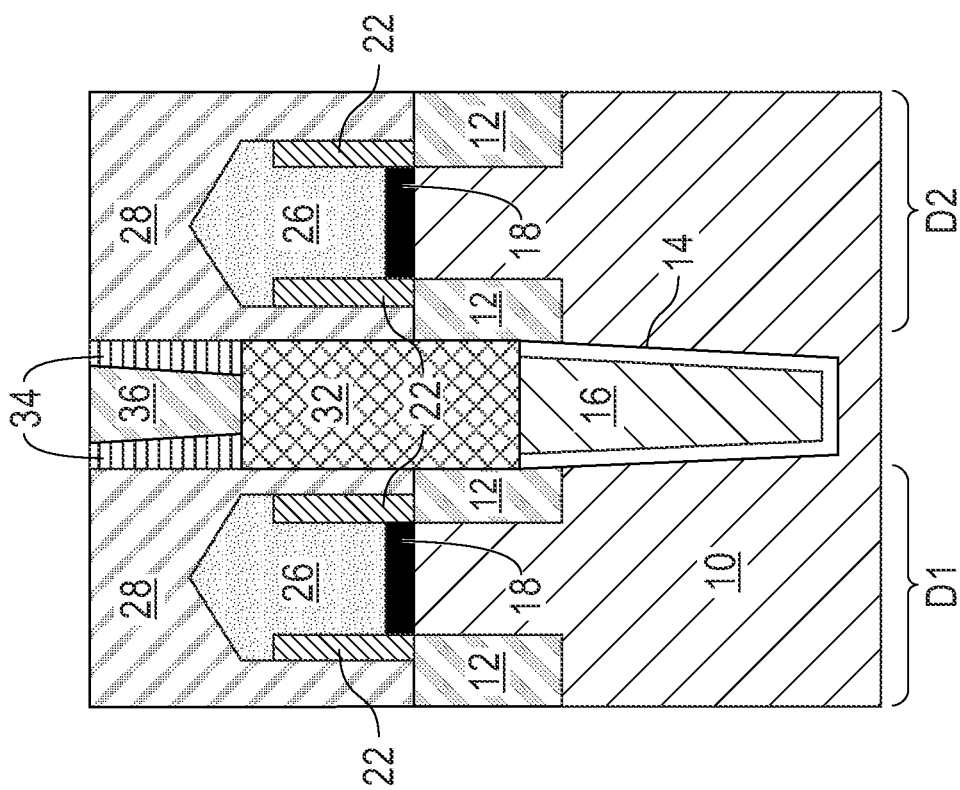

Referring now to FIGS. 9A, 9B and 9C, there are illustrated the exemplary structure shown in FIGS. 8A, 8B and 8C, respectively, after removing the remaining (i.e., individual) sacrificial gate structure 24 present in the first device region D1 and the second device region D2. Gate cavities 39 are formed as shown in FIGS. 9A and 9C. In some embodiments and when a nanosheet stack is used, the sacrificial semiconductor material nanosheets can now be removed from the nanosheet stack to provide suspended semiconductor channel material nanosheets (not shown) in each gate cavity 39. The removal of the sacrificial gate structures 24 can include one or more etching processes that are selective in removing the sacrificial gate structures 24. The removal of the sacrificial semiconductor material nanosheets from the nanosheet stack can be performed utilizing an etch the is selective in removing the sacrificial semiconductor material nanosheets relative to the semiconductor channel material nanosheets. For example, and etch can be used to selectively remove SiGe sacrificial semiconductor material nanosheets relative to Si semiconductor channel material nanosheets.

Figure 10A:
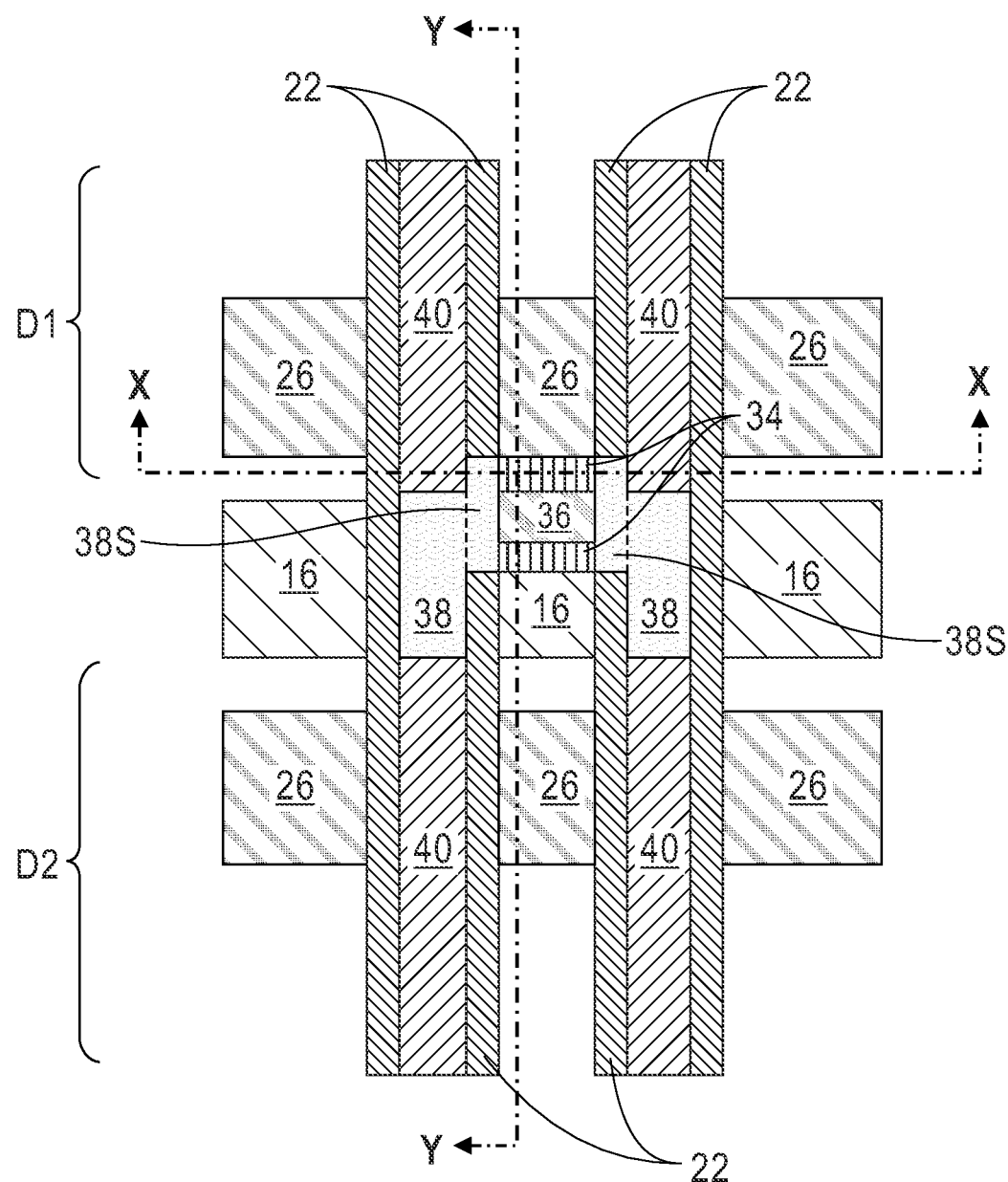
FIGS. 10A, 10B and 10C are various views of the exemplary structure shown in FIGS. 9A, 9B and 9C, respectively, after forming a functional gate structure in at least the volume previously occupied by the removed sacrificial gate structure that was previously present in the first device region and the second device region.
Figure 10C:
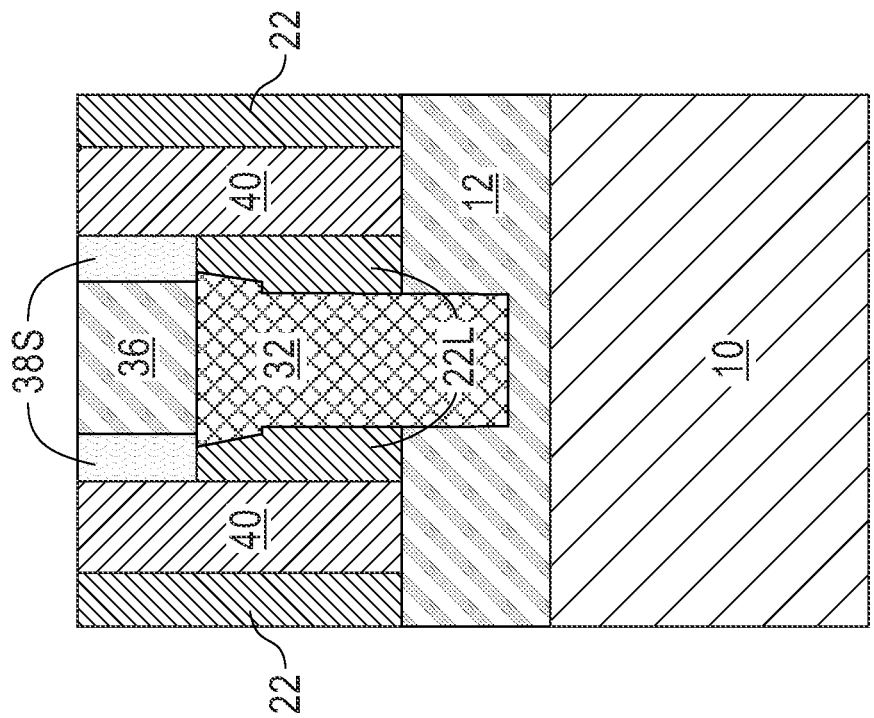
Figure 10B:
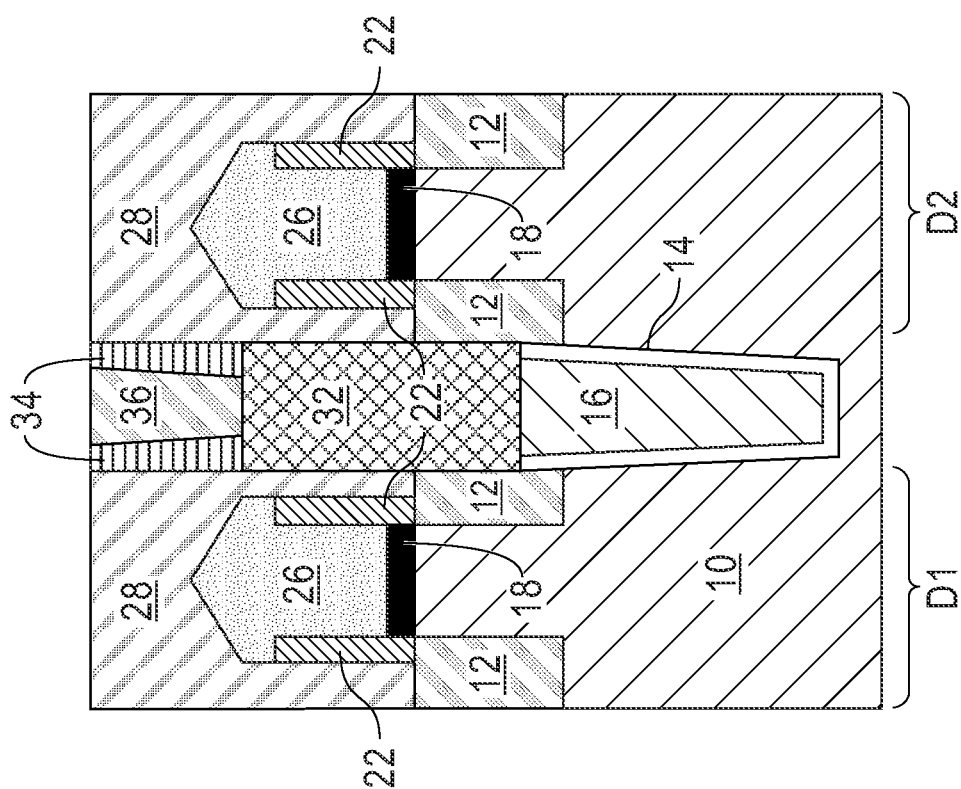

Referring now to FIGS. 10A, 10B and 10C there are illustrated the exemplary structure shown in FIGS. 9A, 9B and 9C, respectively, after forming a functional gate structure 40 in at least the volume previously occupied by the removed sacrificial gate structures 24 that were previously present in the first device region D1 and the second device region D2. It is noted that ends (i.e., end walls) of each functional gate structure 40 present in the first device region D1 face ends (i.e., end walls) of each functional gate structure 40 present in the second device region D2. The functional gate structure 40 includes at least a gate dielectric material layer and a gate electrode; both of which are not individually shown in the drawings of the present application. In some embodiments, the functional gate structure 40 can wrap around each semiconductor channel material nanosheet within a vertical nanosheet stack. As is known, the gate dielectric material layer of the functional gate structure 40 is in direct contact with physically exposed portions of each semiconductor channel material structure, and the gate electrode is located on the gate dielectric material layer. In some embodiments, the functional gate structure 40 includes a work function metal (WFM) layer located between the gate dielectric material layer and the gate electrode. In some embodiments, a gate cap 41 (See, FIG. 13C) is located above a recessed functional gate structure 40. In other embodiments, the gate cap is omitted.

The functional gate structure 40 includes forming a continuous layer of gate dielectric material and a gate electrode material inside and outside each gate cavity 39. The continuous layer of gate dielectric material can include silicon oxide, or a dielectric material having a dielectric constant greater than silicon oxide (such dielectric materials can be referred to as a high-k gate dielectric material). Illustrative examples of high-k gate dielectric materials include metal oxides such as, for example, hafnium dioxide ($HfO_2$), hafnium silicon oxide (HfSiO), hafnium silicon oxynitride (HfSiO), lanthanum oxide ($La_2O_3$), lanthanum aluminum oxide ($LaAlO_3$), zirconium dioxide ($ZrO_2$), zirconium silicon oxide ($ZrSiO_4$), zirconium silicon oxynitride ($ZrSiO_xN_y$), tantalum oxide ($TaO_x$), titanium oxide (TiO), barium strontium titanium oxide ($BaO_6SrTi_2$), barium titanium oxide ($BaTiO_3$), strontium titanium oxide ($SrTiO_3$), yttrium oxide ($Yb_2O_3$), aluminum oxide ($Al_2O_3$), lead scandium tantalum oxide ($Pb(Sc,Ta)O_3$), and/or lead zinc niobite ($Pb(Zn,Nb)O$). The high-k gate dielectric material can further include dopants such as lanthanum (La), aluminum (Al) and/or magnesium (Mg).

The continuous layer of the gate dielectric material can be formed utilizing a deposition process such as, for example, ALD, CVD, PECVD, or PVD. The continuous layer of the gate dielectric material is a conformal layer having a thickness which can range from 1 nm to 10 nm. The continuous layer of gate dielectric material does not fill in the entirety of each gate cavity 39.

The gate electrode material can include an electrically conductive metal-containing material including, but not limited to tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), or gold (Au), tantalum nitride (TaN), titanium nitride (TiN), tantalum carbide ($TaC_x$), titanium carbide (TiC), titanium aluminum carbide, tungsten silicide ($WSi_2$), tungsten nitride (WN), ruthenium oxide ($RuO_2$), cobalt silicide, or nickel silicide. The gate electrode material can be formed utilizing a deposition process such as, for example, ALD, CVD, PECVD, PVD, plating or sputtering. A reflow anneal or a silicide anneal can be used in some embodiments of the present application after conductive metal-containing material deposition has been performed.

In some embodiments, a layer of WFM can be formed on the continuous layer of gate dielectric material prior to forming the gate electrode material. In other embodiments, the gate electrode is composed of only a WFM.

The layer of WFM can be used to set a threshold voltage of the FET to a desired value. In some embodiments, the layer of WFM can be selected to effectuate an n-type threshold voltage shift. "N-type threshold voltage shift" as used herein means a shift in the effective work-function of the work-function metal-containing material towards a conduction band of silicon in a silicon-containing material. In one embodiment, the work function of the n-type work function metal ranges from 4.1 eV to 4.3 eV. Examples of such materials that can effectuate an n-type threshold voltage shift include, but are not limited to, titanium aluminum, titanium aluminum carbide, tantalum nitride, titanium nitride, hafnium nitride, hafnium silicon, or combinations and thereof.

In other embodiments, the layer of WFM can be selected to effectuate a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the effective work-function of the work-function metal-containing material towards a valence band of silicon in the silicon containing material. Examples of such materials that can effectuate a p-type threshold voltage shift include, but are not limited to, titanium nitride, and tantalum carbide, hafnium carbide, and combinations thereof.

The layer of WFM is a conformal layer which can be formed by a conformal deposition process such as, for example, ALD, CVD or PECVD. The layer of WFM layer can have a thickness in the range of 1 nm to 20 nm, although other thickness above or below this range may be used as desired for a particular application.

After forming the continuous layer of the gate dielectric material, the optional layer of WFM and the gate electrode material, a planarization process such as, for example, CMP, is used to remove the continuous layer of the gate dielectric material, the optional layer of WFM and the gate electrode material from outside each gate cavity 39.

The remaining continuous layer of the gate dielectric material that is present inside the gate cavity can be referred to as a gate dielectric material layer, the remaining optional layer of WFM that is present inside the gate cavity can be referred to a WFM layer, and remaining gate electrode material that is present inside the gate cavity provides a gate electrode.

When present gate cap 41 can be composed of a hard mask material such as, for example, silicon dioxide or silicon nitride. The gate cap 41 can be formed by a deposition process, followed by a planarization process.

Figure 11A:
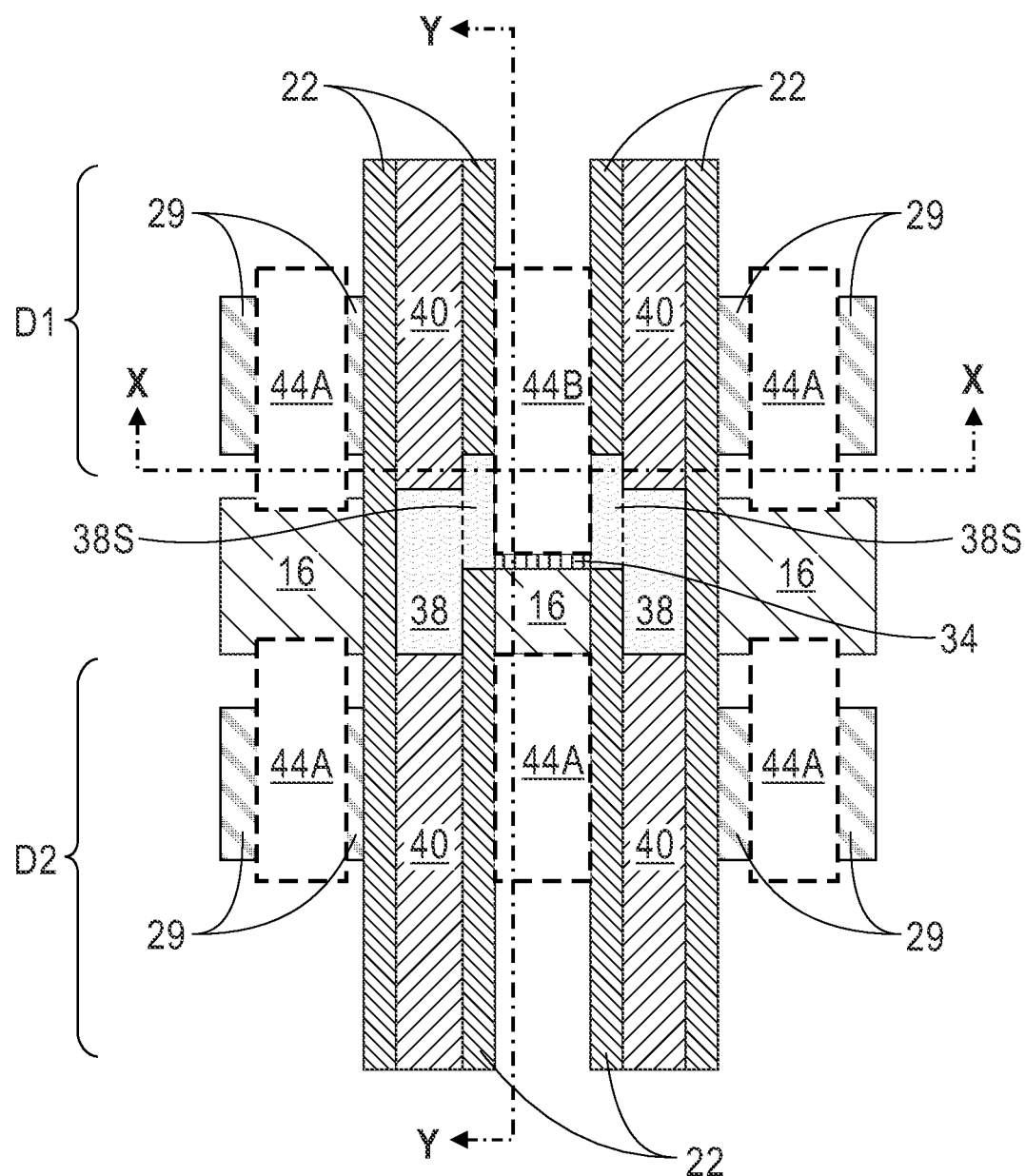
FIGS. 11A, 11B and 11C are various views of the exemplary structure shown in FIGS. 10A, 10B and 10C, respectively, after forming contact openings.
Figure 11C:
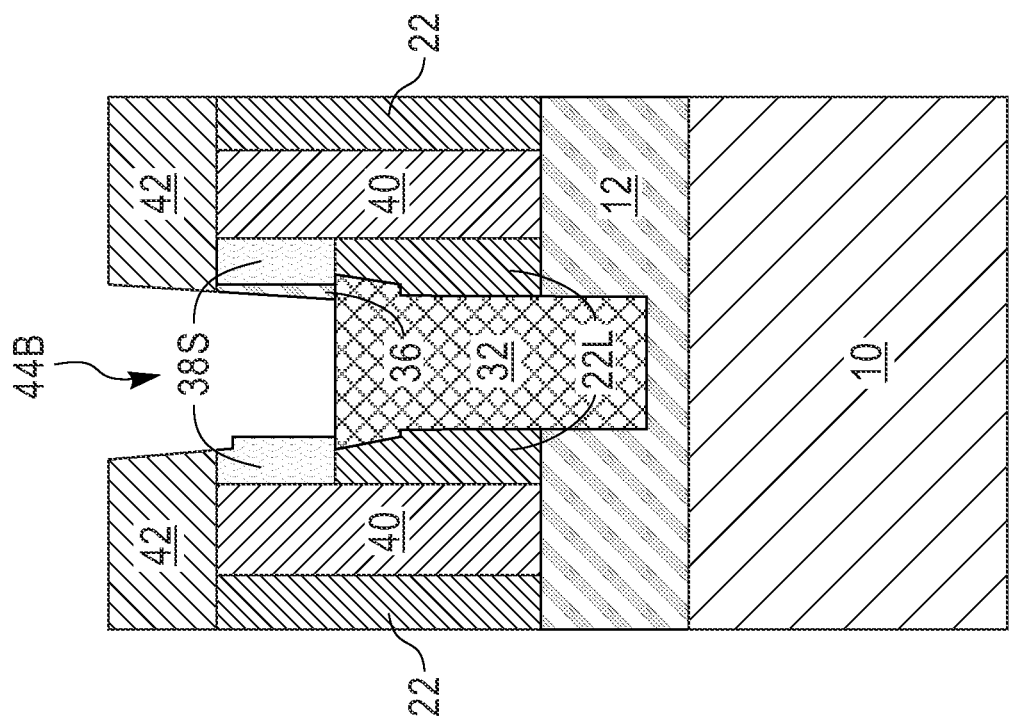
Figure 11B:
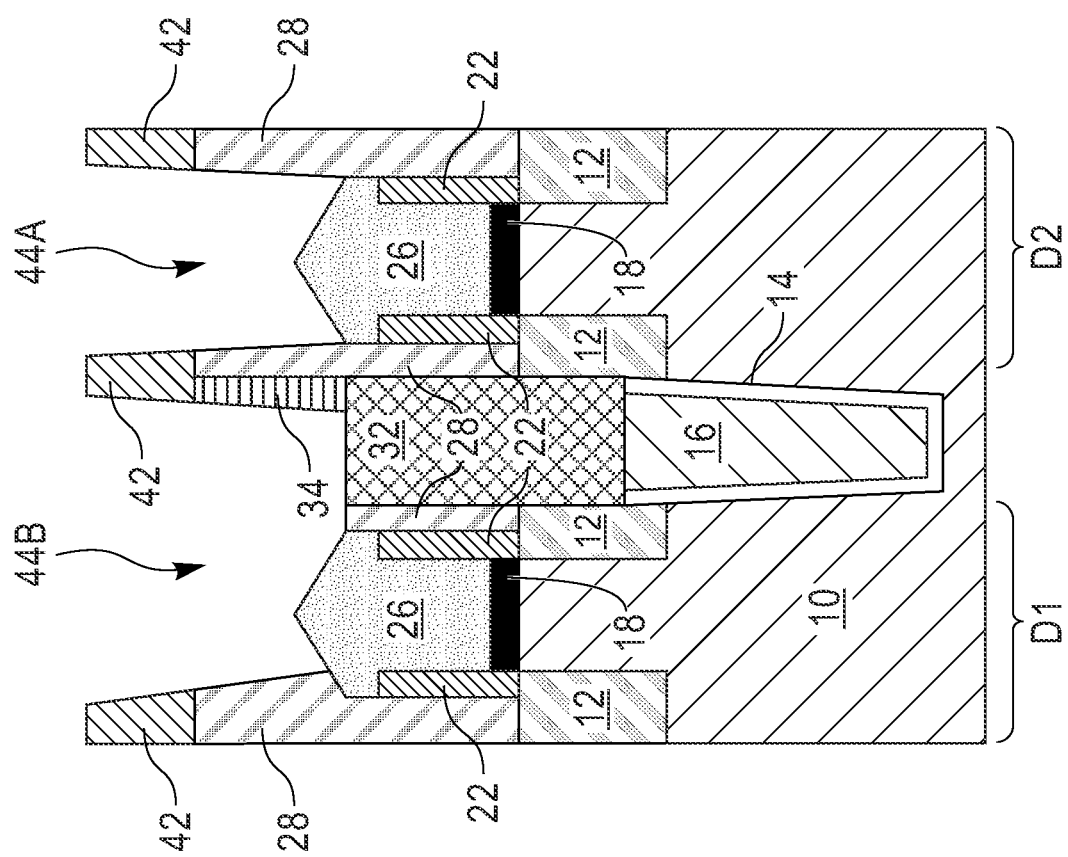

Referring now to FIGS. 11A, 11B and 11C, there is illustrated the exemplary structure shown in FIGS. 10A, 10B and 10C, respectively, after forming contact openings 44A and 44B. Contact opening 44A is a source/drain contact opening in which at least one of the source/drain regions 26 is physically exposed, while contact opening 44B is an upper portion of a VBPR contact opening in which another of the source/drain regions is physically exposed. The VBPR contact opening also physically exposes a surface of the sacrificial dielectric material 32 that is present in the VBPR opening 30. See, for example, FIG. 11B.

The contact openings 44A and 44B can be formed by forming another ILD material layer 42 on ILD material layer 28, the dielectric spacer 22, the functional gate structure 40 and the upper spacer 38S. The another ILD material layer 42 can be composed of a compositionally same or compositionally different dielectric material than the ILD material layer 28. The another ILD material layer 42 can be formed utilizing one of the deposition processes mentioned above in forming ILD material layer 28. The contact openings 44A, 44B are formed by lithography and etching. By forming the upper spacer 38S, the functional gate structure 40 is well protected from being shorted with contact 44B as shown in FIG. 11C.

After forming contact opening 44B, the physically exposed sacrificial dielectric material structure 32 is removed so as to physically expose at least the buried power rail 16; the buried power rail dielectric material liner 14 can also be physically exposed after removing the sacrificial dielectric material structure 32 in contact opening 44B.

Figure 12A:
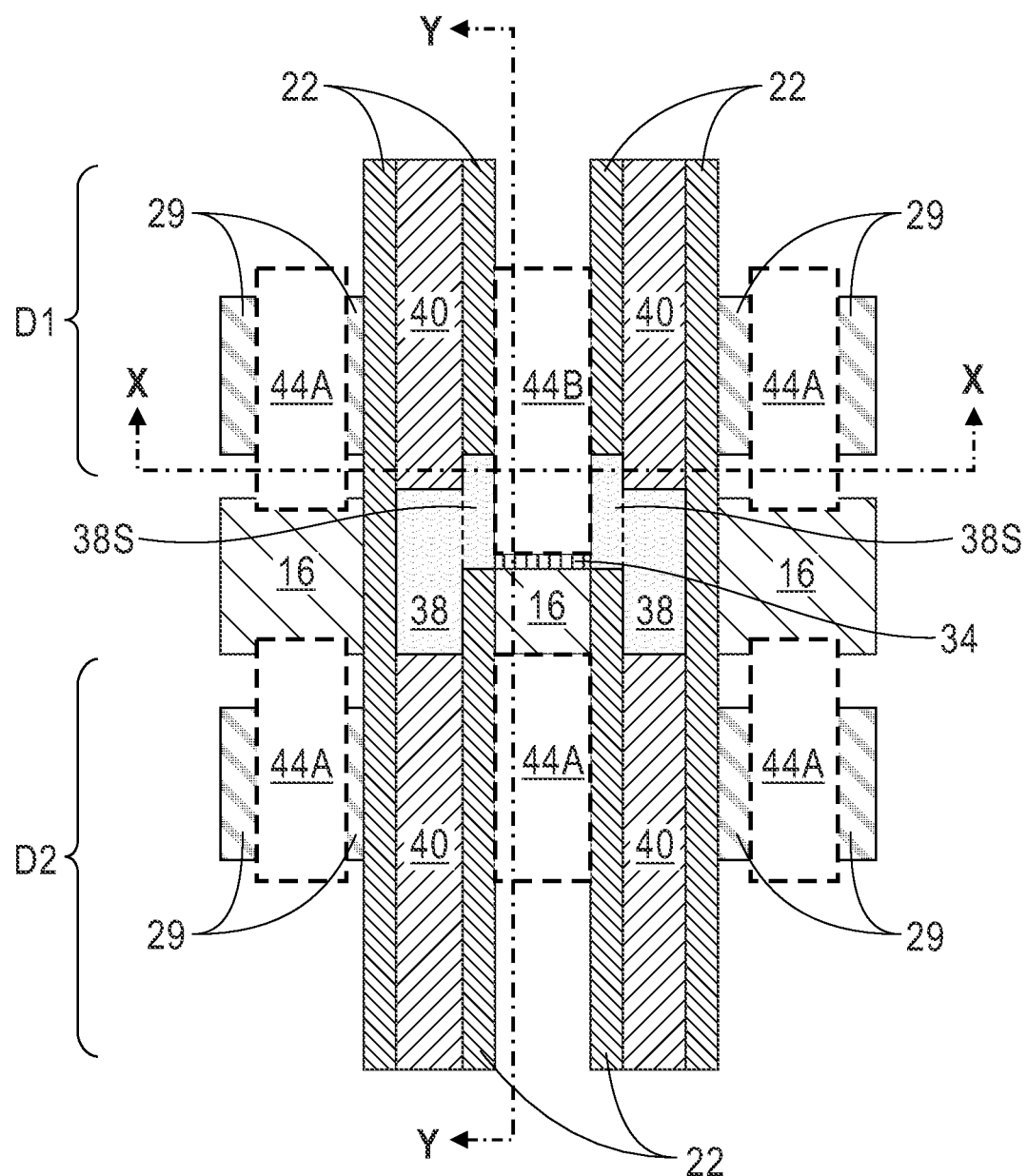
FIGS. 12A, 12B and 12C are various views of the exemplary structure shown in FIGS. 11A, 11B and 11C, respectively, after forming a contact structure in each of the contact openings, wherein at least one of the contact structures is a VBPR contact structure.
Figure 12C:
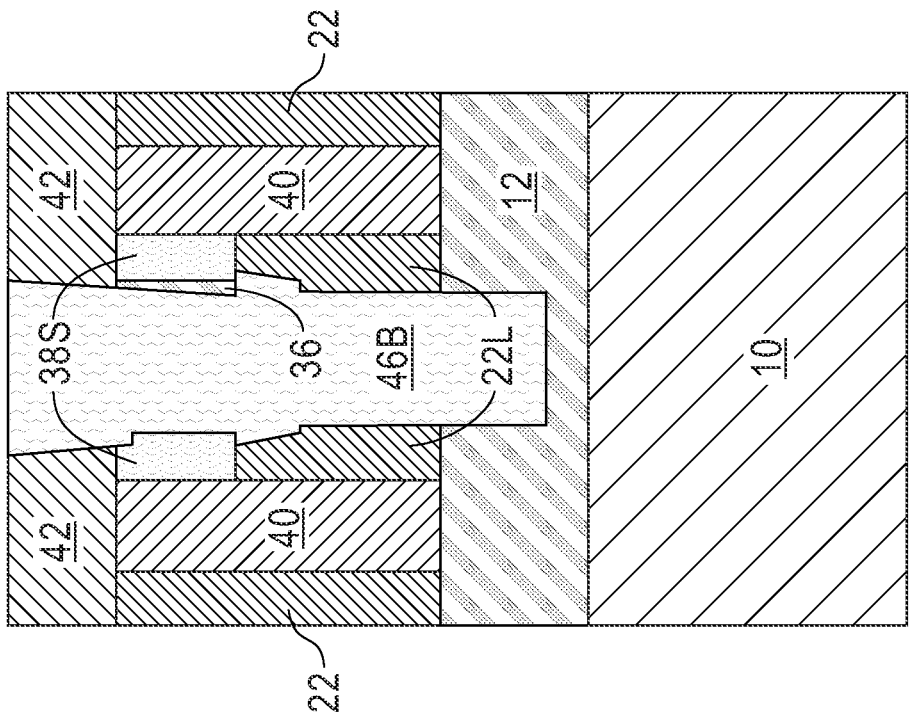
Figure 12B:
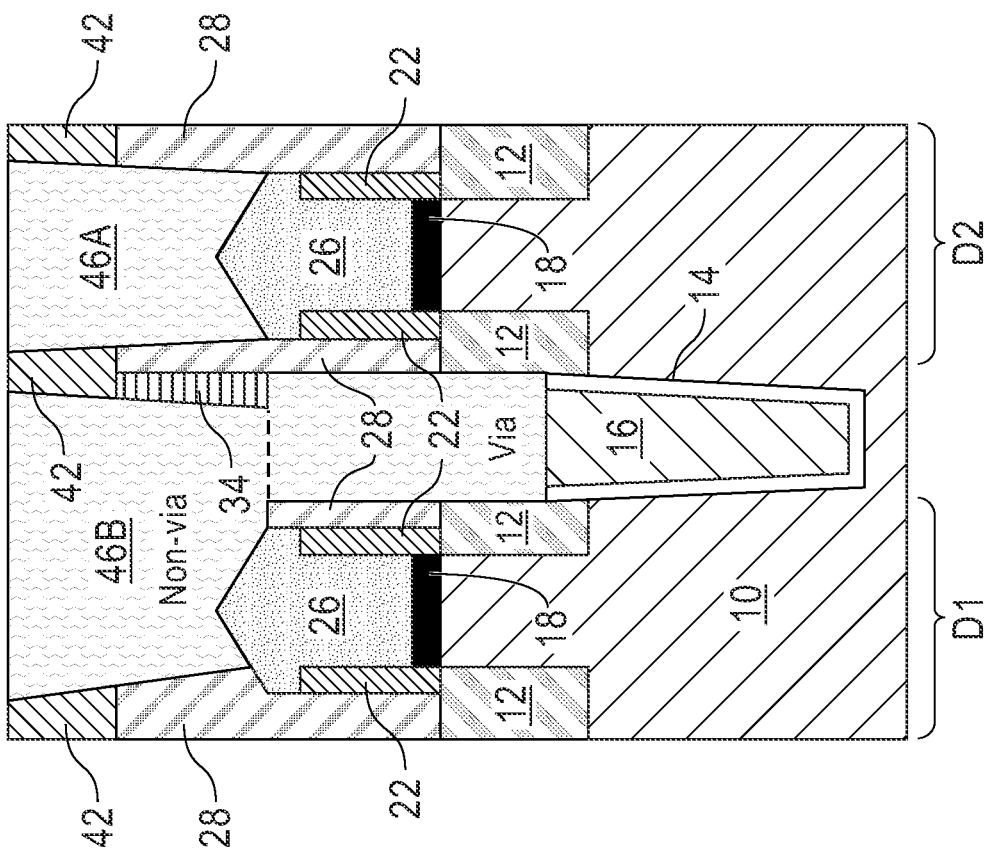

Referring now to FIGS. 12A, 12B and 12C, there are illustrated the exemplary structure shown in FIGS. 11A, 11B and 11C, respectively, after forming a contact structure 46A in each of contact opening 44A and a contact structure 46B in contact opening 44B in which the sacrificial dielectric material structure 32 has been removed therefrom. Each contact structure 46A is a source/drain contact structure that contacts only a source/drain region 26. Contact structure 46B is a VBPR contact structure that includes a via portion and a non-via portion. As is shown, the via portion of the VBPR contact structure (i.e., contact structure 46B) directly contact the physically exposed buried power rail 16 (the via portion can also directly contact the physically exposed buried power rail dielectric material liner 14). The non-via portion of the VBPR contact structure (i.e., contact structure 46B) directly contacts another of the source/drain regions 26. In FIG. 12B (and FIG. 13B), the vertical dotted line is used to distinguish the via portion of the VBPR contact structure 46B and the non-via portion of the VBPR contact structure 46B.

The contact structures 46A, 46B include at least a contact conductor material. An optional contact liner can be present on a sidewall and bottommost surface of each of the contact structures 46A, 46B.

In one or more embodiments in which a contact liner is present, the contact liner (not shown) can include a silicide liner, such as Ti, Ni, NiPt, etc., and a diffusion barrier material. Exemplary diffusion barrier materials include, but are not limited to, Ru, TiN, TaN, WN, WC, an alloy thereof, or a stack thereof such as Ti/TiN and Ti/WC. The contact liner can be formed utilizing a conformal deposition process including PVD, RFPVD, CVD or ALD. The contact liner that is formed can have a thickness ranging from 1 nm to 8 nm, although lesser and greater thicknesses can also be employed.

The contact conductor material can include a metal such as, for example, W, Cu, Al, Co, Ru, Mo, Os, Jr, Rh or an alloy thereof. The contact conductor layer can be formed by any suitable deposition method such as, for example, ALD, CVD, PVD or plating. A planarization process can be used to remove the contact conductor material and the contact liner (when provided) that are located outside the source/drain contact openings. The remaining contact conductor material and if present, the contact liner provide the contact structures 46A, 46B shown in the drawings of the present application.

It is noted that dielectric spacer structure is located along a side of least one first functional gate structure that is laterally adjacent to the via portion of the VBPR contact structure 46B, the dielectric spacer structure comprises base dielectric spacer 22L and a replacement dielectric spacer 38S. The base dielectric spacer 22L has sidewalls that are perpendicular relative to the horizontal topmost surface of the shallow trench isolation structure 12. The base dielectric spacer 22L has a first sidewall portion S1 distal to the functional gate structure 40 that is perpendicular relative to a horizontal topmost surface of the shallow trench isolation structure 12 and a second sidewall portion S2 distal to the functional gate structure 40 that is tapered relative to the first sidewall portion S1, wherein the first sidewall portion S1 of the base dielectric spacer 22L and the second sidewall portion S2 of the base dielectric spacer 22L are in direct physical contact with the VBR contact structure 46B.

Figure 13A:
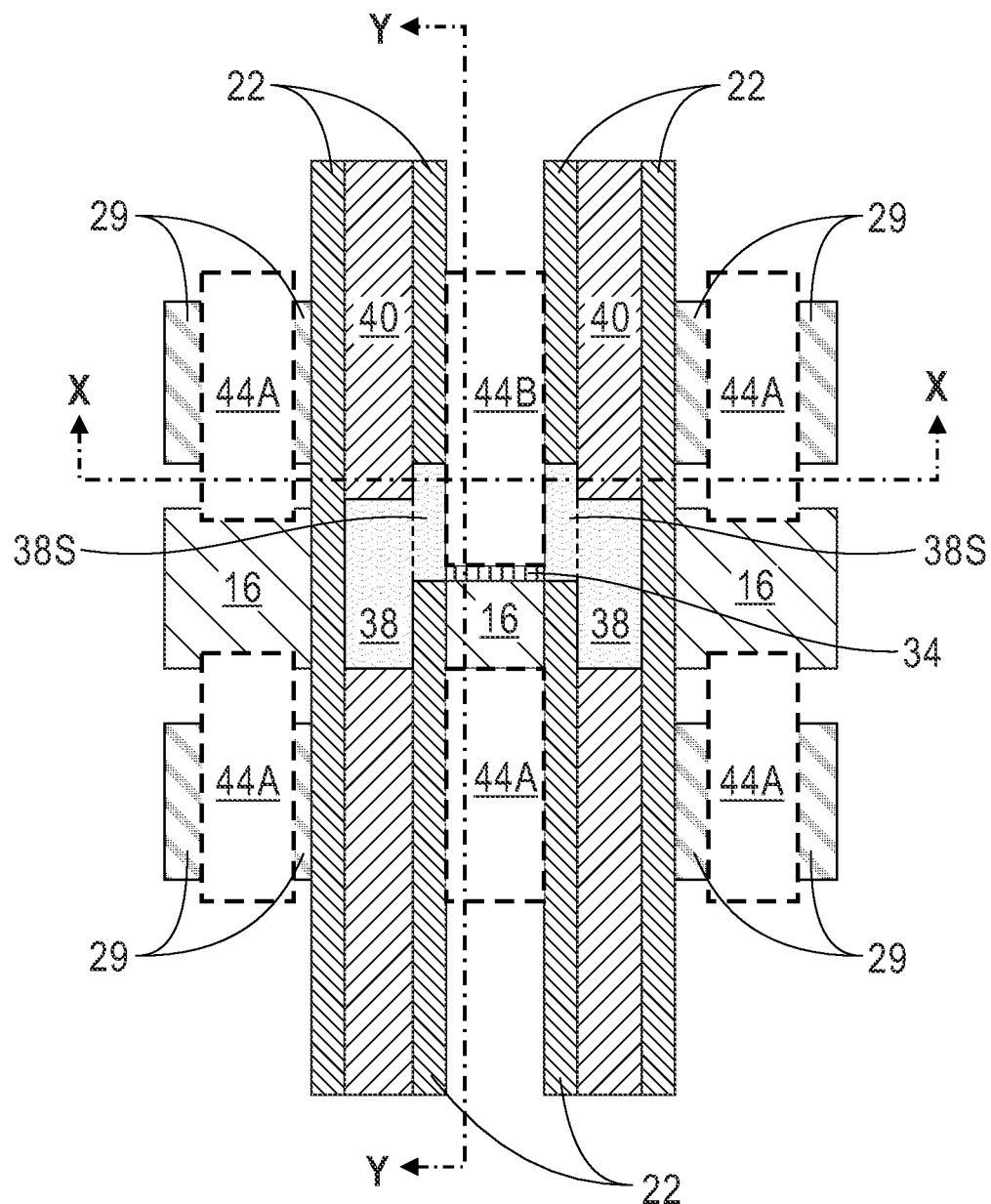
FIGS. 13A, 13B and 13C are various views of an exemplary structure in accordance with another embodiment of the present application.
Figure 13C:
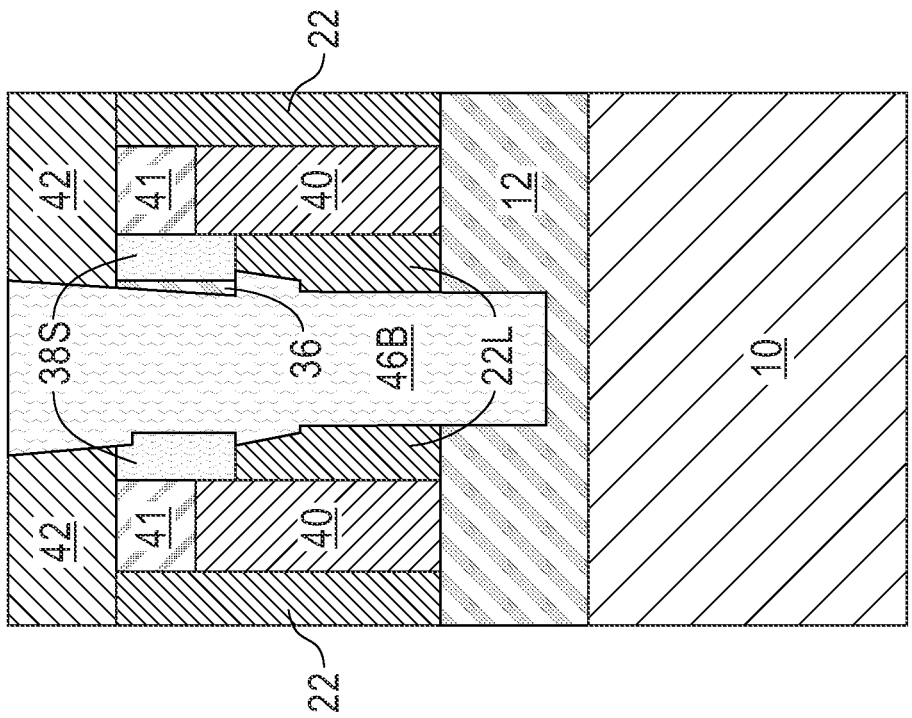
Figure 13B:
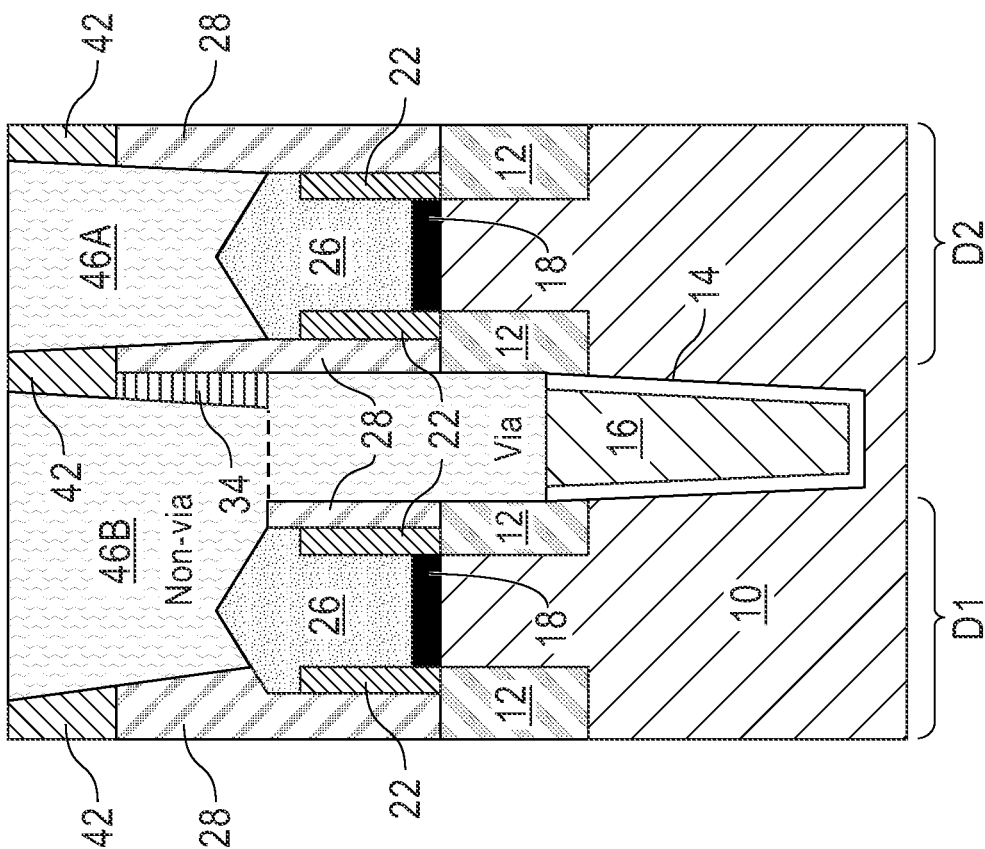

Referring now to FIGS. 13A, 13B and 13C, there are illustrated an exemplary structure in accordance with another embodiment of the present application. This embodiment of the present application is the similar to the embodiment depicted in FIGS. 1A-12C above except that a gate cap 41 is present on a recessed surface of each functional gate structure 40.

In this embodiment, the gate cap 41 has a topmost surface that is coplanar with a topmost surface of the replacement dielectric spacer 38S of the spacer structure, while in the previously illustrated embodiment shown in FIGS. 12A, 12B and 12C, the functional gate structure 40 has a topmost surface that is coplanar with a topmost surface of the replacement dielectric spacer 38S of the spacer structure. In either embodiment, the another interlayer dielectric material layer 42 is located laterally adjacent to the VBPR contact structure 42B and has a topmost surface that is coplanar with a topmost surface of the VBPR contact structure 42B. The topmost surface of VBPR contact structure 42B is also coplanar with a topmost surface of source/drain contact structure 46A.

The above description with respect to FIGS. 1A-13C illustrates an embodiment of the present application in which buried power rail 16 is present in a shallow trench isolation structure 12 and the via-to-buried power rail contact structure 46B contacts the buried power rail 16. In the description to follow, which refers to FIGS. 14A-15B, an another embodiment of the present application is described and illustrated in which a backside power rail 56 is employed and a via-to-backside power rail contact structure 46C contacts the backside power rail 56.

Referring first to FIGS. 14A and 14B, there are illustrated varies views through cut Y-Y and X-X, respectively, shown in FIG. 1 of another exemplary structure in accordance with yet another embodiment of the present application. The another exemplary structure is similar to the one depicted in FIGS. 12A, 12B and 12C except that no buried power rail is present in the another exemplary structure, and the another exemplary structure includes a via-to-backside power rail (VBPR) contact structure 46C, a back-end-of-the-line (BEOL) interconnect structure 50 and a carrier wafer 52. VBPR contact structure 46C is structurally (i.e., it has a via portion and a non-via portion) and materially the same as VBPR contact structure 46B described in the present application. As is shown in FIG. 14A, the non-via portion of VBPR contact structure 46C is in contact with a source/drain region 26 of a functional gate structure that is present in the first device region D1; the via portion of the VBPR contact structure 46C is not connected to any power rail at this point of the present application.

The another exemplary structure shown in FIGS. 14A-14B can be formed by utilizing the basic processing steps mentioned above for the embodiment depicted in FIGS. 1A-13C (with or without the gate cap 41) except that no buried power rail is formed. Next, BEOL interconnect structure 50 is formed utilizing techniques well known to those skilled in the art. For example, the BEOL interconnect structure 50 can be formed utilizing a single damascene or a dual damascene process. The BEOL interconnect structure 50 includes at least one interconnect level that includes electrically conductive structures (not separately shown), such as, for example, Cu structures, embedded in an interconnect dielectric material layer (not separately shown), such as, for example, one of the dielectric materials mentioned above for the ILD material layer 28. At least a first set of the electrically conductive structures would contact the non-via portion of the VBPR contact structure 46C, and a second set of the electrically conductive structure would contact the source/drain contact structure 46A. Carrier wafer 52 is the formed on the BEOL interconnect structure 50 utilizing techniques, such as, for example, wafer bonding, that are well known to those skilled in the art. The carrier wafer 52 can include one of the semiconductor materials mentioned above for the semiconductor channel material structures.

Referring now to FIGS. 15A and 15B, there is illustrated the exemplary structure shown in FIGS. 14A and 14B, respectively, after further device processing include flipping the structure shown in FIGS. 14A-14B 180°, semiconductor substrate 10 removal, backside interlayer dielectric material layer 54 deposition, backside power rail 56 formation, and backside power distribution network 58 formation. The flipping of the structure shown in FIGS. 14A-14B can be performed manually or utilizing a robot arm. This flipping revels a backside surface of semiconductor substrate 10. The term "backside surface" denotes a surface that is opposite a front side surface in which one or more semiconductor devices will be present.

The reveled semiconductor substrate 10 is then removed utilizing an etching process that is selective in removing the semiconductor substrate 10 relative to the shallow trench isolation structure 12 and the buried dielectric layer 18 as well as the VBPR contact structure 46C. Backside interlayer dielectric material layer 54 is then formed utilizing a deposition process such, as for example, CVD, PECVD, PVD or spin-on coating. The backside interlayer dielectric material layer 54 can include one of the dielectric materials mentioned above for ILD material layer 28. Backside interlayer dielectric material layer 54 is formed on a backside surface of the shallow trench isolation structure 12.

Next, backside power rail 56 is formed in a portion of the backside interlayer dielectric material layer 54. An optional backside power rail dielectric liner (not shown) can be present along a sidewall and a bottom wall of the backside power rail 56. The optional backside power rail dielectric liner and the backside power rail 56 can be formed utilizing the techniques mentioned above for forming the buried power rail dielectric material liner 14 and buried power rail 16 in the previous embodiment of the present application. The optional backside power rail dielectric liner and backside power rail 56 can be include materials mentioned above the buried power rail dielectric material liner 14 and buried power rail 16, respectively. The backside power rail 56 directly or indirectly through the optional backside power rail dielectric liner contacts a surface of the via portion of the VBPR contact structure 46C. At least the backside power rail 56 has a topmost surface that is coplanar with a topmost surface of the backside interlayer dielectric material layer 54.

Backside power distribution network 58 is then formed on physically exposes surface of the backside power rail 56 and backside interlayer dielectric material layer 54. The backside power distribution network 58 includes networks well known to those skilled in the art and the backside power distribution network 58 can be formed utilizing techniques well known to those skilled in the art.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a first device region including at least one first functional gate structure;
   a second device region that is located laterally adjacent to the first device region and includes at least one second functional gate structure;
   a shallow trench isolation structure located between the first device region and the second device region;
   a backside power rail located in a backside interconnect dielectric material layer that is located on a backside surface of the shallow trench isolation structure;
   a via-to-backside power rail (VBPR) contact structure having a via portion contacting a surface of the backside power rail and a non-via portion contacting a source/drain region of the at least one first functional gate structure; and
   a dielectric spacer structure located along a side of the at least one first functional gate structure that is laterally adjacent to the via portion of the via-to-backside power rail contact structure, the dielectric spacer structure comprising a base dielectric spacer and a replacement dielectric spacer, wherein another side of the at least one first functional gate structure opposite the side of the at least one first functional gate structure that is laterally adjacent to the via portion of the VBPR contact structure contains only a single dielectric spacer, wherein the single dielectric spacer is composed of a dielectric spacer material that is compositionally a same dielectric spacer material as that of the base dielectric spacer.

2. The semiconductor structure of claim 1, further comprising a backside power distribution network located on a surface of both the backside power rail and the backside interconnect dielectric material layer.

3. The semiconductor structure of claim 1, wherein a surface of the via-to-backside power rail contact structure contacts a back-end-of-the-line (BEOL) interconnect structure, and the BEOL interconnect structure is located on a surface of a carrier wafer.

4. The semiconductor structure of claim 1, further comprising a source/drain contact structure contacting a source/drain region of the at least one second functional gate structure.

5. The semiconductor structure of claim 1, wherein the at least one second functional gate structure contains only another single dielectric spacer, wherein the another single dielectric spacer is composed of a dielectric spacer material that is compositionally a same dielectric spacer material as that of the base dielectric spacer.

6. The semiconductor structure of claim 1, wherein the at least one first functional gate structure comprises a neighboring pair of first functional gate structures, and a portion of the VBPR contact structure is present between the neighboring pair of first functional gate structures, wherein the portion of the VBPR contact structure that is located between the neighboring pair of first functional gate structures contacts a surface of the shallow trench isolation structure.

7. The semiconductor structure of claim 1, wherein the base dielectric spacer has a first sidewall portion distal to the first functional gate structure that is perpendicular relative to a horizontal topmost surface of the shallow trench isolation structure and a second sidewall portion distal to the first functional gate structure that is tapered relative to the first sidewall portion, wherein the first sidewall portion of the base dielectric spacer and the second sidewall portion of the base dielectric spacer are in direct physical contact with the VBPR contact structure.

8. The semiconductor structure of claim 1, further comprising a gate cut dielectric material located in a gate cut trench that is located in a region including the shallow trench isolation structure and between the first device region and the second device region, wherein a portion of the gate cut dielectric material extends above the base dielectric spacer and provides the replacement dielectric spacer, and wherein the gate cut dielectric material separates one end of the at least one first functional gate structure from one end of the at least one second functional gate structure.

9. A semiconductor structure comprising:
   a first device region including at least one first functional gate structure;
   a second device region that is located laterally adjacent to the first device region and includes at least one second functional gate structure;
   a shallow trench isolation structure located between the first device region and the second device region;
   a backside power rail located in a backside interconnect dielectric material layer that is located on a backside surface of the shallow trench isolation structure;
   a via-to-backside power rail (VBPR) contact structure having a via portion contacting a surface of the backside power rail and a non-via portion contacting a source/drain region of the at least one first functional gate structure; and
   a dielectric spacer structure located along a side of the at least one first functional gate structure that is laterally adjacent to the via portion of the via-to-backside power rail contact structure, the dielectric spacer structure comprising a base dielectric spacer and a replacement dielectric spacer, wherein the base dielectric spacer has a first sidewall portion distal to the first functional gate structure that is perpendicular relative to a horizontal topmost surface of the shallow trench isolation structure and a second sidewall portion distal to the first functional gate structure that is tapered relative to the first sidewall portion, wherein the first sidewall portion of the base dielectric spacer and the second sidewall portion of the base dielectric spacer are in direct physical contact with the VBPR contact structure.

10. A semiconductor structure comprising:
    a first device region including at least one first functional gate structure;

a second device region that is located laterally adjacent to the first device region and includes at least one second functional gate structure;

a shallow trench isolation structure located between the first device region and the second device region;

a backside power rail located in a backside interconnect dielectric material layer that is located on a backside surface of the shallow trench isolation structure;

a via-to-backside power rail (VBPR) contact structure having a via portion contacting a surface of the backside power rail and a non-via portion contacting a source/drain region of the at least one first functional gate structure;

a dielectric spacer structure located along a side of the at least one first functional gate structure that is laterally adjacent to the via portion of the via-to-backside power rail contact structure, the dielectric spacer structure comprising a base dielectric spacer and a replacement dielectric spacer; and a gate cut dielectric material located in a gate cut trench that is located in a region including the shallow trench isolation structure and between the first device region and the second device region, wherein a portion of the gate cut dielectric material extends above the base dielectric spacer and provides the replacement dielectric spacer, and wherein the gate cut dielectric material separates one end of the at least one first functional gate structure from one end of the at least one second functional gate structure.

* * * * *